(12) United States Patent
Bruland et al.

(10) Patent No.: US 8,049,135 B2
(45) Date of Patent: Nov. 1, 2011

(54) SYSTEMS AND METHODS FOR ALIGNMENT OF LASER BEAM(S) FOR SEMICONDUCTOR LINK PROCESSING

(75) Inventors: Kelly J. Bruland, Portland, OR (US); Stephen N. Swaringen, Rockwall, TX (US)

(73) Assignee: Electro Scientific Industries, Inc., Portland, OR (US)

( * ) Notice: Subject to any disclaimer, the term of this patent is extended or adjusted under 35 U.S.C. 154(b) by 1400 days.

(21) Appl. No.: 11/481,562

(22) Filed: Jul. 5, 2006

(65) Prior Publication Data
US 2007/0020785 A1    Jan. 25, 2007

Related U.S. Application Data

(63) Continuation-in-part of application No. 11/051,265, filed on Feb. 4, 2005, now Pat. No. 7,435,927.

(60) Provisional application No. 60/580,917, filed on Jun. 18, 2004.

(51) Int. Cl.
*B23K 26/38* (2006.01)
*B23K 26/04* (2006.01)

(52) U.S. Cl. ......... 219/121.69; 219/121.68; 219/121.73; 219/121.81; 219/121.83

(58) Field of Classification Search .............. 219/121.68, 219/121.69, 121.73, 121.74, 121.79, 121.8, 219/121.81, 121.83; 359/201.1, 201.2, 202.1, 359/204.2, 204.3; 438/16, 795
See application file for complete search history.

(56) References Cited

U.S. PATENT DOCUMENTS

| | | | | |
|---|---|---|---|---|
| 3,609,381 A | * | 9/1971 | Hartfield | 359/618 |
| 3,622,740 A | * | 11/1971 | Ravussin et al. | 219/121.79 |
| 4,524,280 A | * | 6/1985 | Ishikawa | 356/400 |
| 4,526,447 A | * | 7/1985 | Taylor | 219/121.78 |
| 4,532,402 A |   | 7/1985 | Overbeck | |
| 4,584,455 A | * | 4/1986 | Tomizawa | 219/121.68 |
| 4,618,759 A | * | 10/1986 | Muller et al. | 219/121.79 |
| 5,065,330 A | * | 11/1991 | Karube et al. | 219/121.83 |
| 5,090,798 A |   | 2/1992 | Kohayakawa | |
| 5,107,365 A | * | 4/1992 | Ota | 359/213.1 |
| 5,315,111 A | * | 5/1994 | Burns et al. | 219/121.8 |

(Continued)

FOREIGN PATENT DOCUMENTS

DE    10150129 C1  *  4/2003

(Continued)

OTHER PUBLICATIONS

Machine translation of Japan Patent No. 11-245,073, Sep. 2009.*

(Continued)

*Primary Examiner* — Geoffrey S Evans
(74) *Attorney, Agent, or Firm* — Stoel Rives LLP

(57) ABSTRACT

A method makes a discrete adjustment to static alignment of a laser beam in a machine for selectively irradiating conductive links on or within a semiconductor substrate using the laser beam. The laser beam propagates along a beam path having an axis extending from a laser to a laser beam spot at a location on or within the semiconductor substrate. The method generates, based on at least one measured characteristic of the laser beam, at least one signal to control an adjustable optical element of the machine effecting the laser beam path. The method also sends said at least one signal to the adjustable optical element. The method then adjusts the adjustable optical element in response to said at least one signal so as to improve static alignment of the laser beam path axis.

46 Claims, 10 Drawing Sheets

U.S. PATENT DOCUMENTS

| | | | |
|---|---|---|---|
| 5,449,882 A * | 9/1995 | Black et al. | 219/121.83 |
| 5,528,372 A * | 6/1996 | Kawashima | 356/401 |
| 5,615,013 A * | 3/1997 | Rueb et al. | 356/615 |
| 5,923,418 A * | 7/1999 | Clark et al. | 356/153 |
| 6,002,706 A * | 12/1999 | Staver et al. | 372/108 |
| 6,025,256 A * | 2/2000 | Swenson et al. | 438/601 |
| 6,063,651 A * | 5/2000 | Edelstein et al. | 438/799 |
| 6,103,991 A * | 8/2000 | Domae et al. | 219/121.69 |
| 7,119,351 B2 * | 10/2006 | Woelki | 250/559.4 |
| 2002/0141035 A1 * | 10/2002 | Davidson et al. | 359/285 |
| 2006/0055928 A1 * | 3/2006 | Chang et al. | 356/400 |

FOREIGN PATENT DOCUMENTS

| | | | |
|---|---|---|---|
| JP | 61-241943 A * | 10/1986 | |
| JP | 63-2581 A * | 1/1988 | |
| JP | 2-137682 A * | 5/1990 | |
| JP | 3-193284 A * | 8/1991 | |
| JP | 11-19788 A * | 1/1999 | |
| JP | 11-245073 A * | 9/1999 | |
| JP | 10020604 C1 * | 7/2001 | |
| KR | 2005032239 A | 4/2005 | |
| WO | WO 9831049 A | 7/1998 | |

OTHER PUBLICATIONS

Machine translation of Japan Patent No. 11-19,788, Sep. 2009.*
Response to Written Opinion of International Searching Authority, PCT/US2007/072683, filed Mar. 11, 2008.
International Search Report and Written Opinion for PCT/US2007/072683, completed Dec. 17, 2007.
Unofficial machine translation of DE 10020604, Aug. 30, 2010.
Unofficial machine translation of DE 10150129, Aug. 31, 2010.

* cited by examiner

SYSTEMS AND METHODS FOR ALIGNMENT OF LASER BEAM(S) FOR SEMICONDUCTOR LINK PROCESSING

RELATED APPLICATIONS

This application is a continuation-in-part of U.S. patent application Ser. No. 11/051,265, filed Feb. 4, 2005, entitled "Semiconductor Structure Processing Using Multiple Laterally Spaced Laser Beam Spots With On-Axis Offset," now U.S. Pat. No. 7,435,927, which claims priority to U.S. Provisional Application No. 60/580,917, filed Jun. 18, 2004, and entitled "Multiple-Beam Semiconductor Link Processing." Both of the preceding applications are incorporated by reference herein.

The following other U.S. Patent Applications filed Feb. 4, 2005, are also incorporated by reference herein:

application Ser. No. 11/051,262, entitled "Semiconductor Structure Processing Using Multiple Laterally Spaced Laser Beam Spots Delivering Multiple Blows," now U.S. Pat. No. 7,687,740;

application Ser. No. 11/052,014, entitled "Semiconductor Structure Processing Using Multiple Laterally Spaced Laser Beam Spots with Joint Velocity Profiling," now U.S. Pat. No. 7,629,234;

application Ser. No. 11/051,500, entitled "Semiconductor Structure Processing Using Multiple Laser Beam Spots Spaced On-Axis Delivered Simultaneously," now pending;

application Ser. No. 11/052,000 entitled "Semiconductor Structure Processing Using Multiple Laser Beam Spots Spaced On-Axis to Increase Single-Blow Throughput," now pending;

application Ser. No. 11/051,263, entitled "Semiconductor Structure Processing Using Multiple Laser Beam Spots Spaced On-Axis on Non-Adjacent Structures," now pending;

application Ser. No. 11/051,958, entitled "Semiconductor Structure Processing Using Multiple Laser Beam Spots Spaced On-Axis with Cross-Axis Offset," now U.S. Pat. No. 7,425,471; and application Ser. No. 11/051,261, entitled "Semiconductor Structure Processing Using Multiple Laser Beam Spots Overlapping Lengthwise on a Structure," now U.S. Pat. No. 7,633,034.

TECHNICAL FIELD

This disclosure relates generally to manufacturing semiconductor integrated circuits and more particularly to the use of laser beams to process structures on or within a semiconductor integrated circuit.

BACKGROUND INFORMATION

During their fabrication process, ICs (integrated circuits) often incur defects for various reasons. For that reason, IC devices are usually designed to contain redundant circuit elements, such as spare rows and columns of memory cells in semiconductor memory devices, e.g., a DRAM (dynamic random access memory), an SRAM (static random access memory), or an embedded memory. Such devices are also designed to include particular laser-severable links between electrical contacts of the redundant circuit elements. Such links can be removed, for example, to disconnect a defective memory cell and to substitute a replacement redundant cell. Similar techniques are also used to sever links in order to program or configure logic products, such as gate arrays or ASICs (application-specific integrated circuits). After an IC has been fabricated, its circuit elements are tested for defects, and the locations of defects may be recorded in a database. Combined with positional information regarding the layout of the IC and the location of its circuit elements, a laser-based link processing system can be employed to remove selected links so as to make the IC useful.

Laser-severable links are typically about 0.5-1 microns (μm) thick, about 0.5-1 μm wide, and about 8 μm in length. Circuit element in an IC, and thus links between those elements, are typically arranged in a regular geometric arrangement, such as in regular rows. In a typical row of links, the center-to-center pitch between adjacent links is about 2-3 μm. These dimensions are representative, and are declining as technological advances allow for the fabrication of workpieces with smaller features and the creation of laser processing systems with greater accuracy and smaller focused laser beam spots. Although the most prevalent link materials have been polysilicon and like compositions, memory manufacturers have more recently adopted a variety of more conductive metallic link materials that may include, but are not limited to, aluminum, copper, gold, nickel, titanium, tungsten, platinum, as well as other metals, metal alloys, metal nitrides such as titanium or tantalum nitride, metal suicides such as tungsten silicide, or other metal-like materials.

Conventional laser-based semiconductor link processing systems focus a single pulse of laser output having a pulse width of about 4 to 30 nanoseconds (ns) at each link. The laser beam is incident upon the IC with a footprint or spot size large enough to remove one and only one link at a time. When a laser pulse impinges a polysilicon or metal link positioned above a silicon substrate and between component layers of a passivation layer stack including an overlying passivation layer, which is typically 2000-10,000 angstrom (Å) thick, and an underlying passivation layer, the silicon substrate absorbs a relatively small proportional quantity of infrared (IR) radiation and the passivation layers (silicon dioxide or silicon nitride) are relatively transparent to IR radiation. Infrared (IR) and visible laser wavelengths (e.g., 0.522 μm, 1.047 μm, 1.064 μm, 1.321 μm, and 1.34 μm) have been employed for more than 20 years to remove circuit links.

Laser processing systems have traditionally employed a single laser pulse focused into a small spot for link removal. Banks of links to be removed are typically arranged on the wafer in a straight row, an illustrative one of which is shown in FIG. 1. The row need not be perfectly straight, although typically it is quite straight. The links are processed by the system in a link run 120, which is also referred to as an on-the-fly ("OTF") run. During the link run 120, the laser beam is pulsed as a stage positioner passes the row of links across a focused laser spot location 110. The stage typically moves along a single axis at a time and does not stop at each link position. Thus the link run 120 is a processing pass down a row of links in a generally lengthwise direction (horizontally across the page as shown.) Moreover, the lengthwise direction of the link run 120 need not be exactly straight or perpendicular to the lengthwise direction of the individual links that constitute the row, although that is typically approximately true. Impingent upon selected links in the link run 120 is a laser beam whose propagation path is along an axis. The position at which that axis intersects the workpiece continually advances along the link run 120 while pulsing the laser to selectively remove links. The laser is triggered to emit a pulse and sever a link when the wafer and optical components have a relative position such that the pulse energy will impinge upon the link (e.g., when the laser spot 110 matches a trigger position 130). Some of the links are not irradiated and left as unprocessed links 140, while others are irradiated to become severed links 150. Although we say that the laser beam spot 110 advances along the row of links, that is a linguistic shorthand. More precisely, a spot results from a laser beam when the laser beam is on. In the case of an intermittent laser beam, such as a pulsed laser beam, the resulting spot on the IC workpiece comes and goes as the laser beam turns on and off. However, the laser beam propagates along a propagation path having an axis of propagation, and the path and axis always exists whether the beam is on or not. Thus, to be precise, a laser beam path or axis moves along the link run. At any given time during a link run, the axis intersects the IC workpiece either on a link or between two adjacent links. When a laser beam axis intersects a link 150 that has been selected for removal, the laser beam is energized to sever the link 150. When the laser axis is moving along a bank of regular spaced links (with the approximately uniform pitch), the laser beam can be pulsed periodically at a rate equivalent to and synchronized in phase with the axis's crossing of links. The laser pulses can be selectively passed or blocked to sever a given link or leave it intact. While the spot 110 is illustrated as having a circular shape in FIG. 1 and elsewhere, it may have any arbitrary shape that a laser beam can produce.

FIG. 2 illustrates a typical link processing system that adjusts the spot position by moving a wafer 240 in an XY plane underneath a stationary optics table 210. The optics table 210 supports a laser 220, a mirror 225, a focusing lens 230, and possibly other optical hardware. The wafer 240 is moved underneath in the XY plane by placing it on a chuck 250 that is carried by a motion stage 260. Alternatively, the wafer 240 can be held still while the optical equipment on the optics table 210 move. As yet another alternative, both the wafer 240 and the optical equipment on the optics table 210 may move to impart a desired relative motion.

FIG. 3A depicts a top view representation of the wafer 240, which includes a number of dies 242. The dies 242 are generally laid out in a regular geometric arrangement. A group of contiguous dies in a typically rectangular pattern constitutes an alignment region 244, at or near the corners of which may be dedicated alignment targets 246. There may be additional alignment targets (not shown) on or near each die. The alignment targets 246 can be used to align the laser beam spot 110 to the wafer 240. Alignment data gathered from the alignment targets 246 in each corner of an alignment region 244 can be used to calculate the positions of links to be processed within each die in the alignment region 244. For example, surface fitting algorithms can be applied to the known corner alignment target data to fit a surface model to the alignment region. This process is sometimes referred to as position geometry correction (PGC).

FIG. 3B is an illustration of link runs across a semiconductor die 242. Both X direction link runs (along the X direction trajectories 310) and Y direction link runs (along the Y direction trajectories 320) are shown. Circuit elements within a given die (which are typically all the same on a given wafer) are typically arranged in a regular geometric arrangement, as are the links between those elements. The links usually lie in regular rows in groups which are termed "link banks," having an approximately uniform center-to-center pitch spacing and extending in orthogonal X and Y directions. To remove selected links in a link bank, the beam spot 110 continuously advances along the link bank at an approximately uniform speed while the laser 110 emits pulses to selectively remove links. The laser 110 is triggered to emit a pulse and thereby to sever a link at a selected target position when the laser beam spot is on the target position. As a result, some of the links are not irradiated and left as unprocessed links, while others are irradiated to become severed or otherwise physically altered. The process of progressing across some or all of the wafer 240 and processing selected links with laser radiation is termed a "link run," more particularly a "processing link run" (or simply "processing run"), as illustrated in greater detail in FIG. 1 above.

A conventional sequential link blowing process requires scanning the XY motion stage 260 across the wafer 240 once for each link run. Repeatedly scanning back and forth across the wafer 240 results in complete wafer processing. A machine typically scans back and forth processing numerous X-axis link runs 310 before processing a batch of Y-axis link runs 320 (or vice versa). This example is merely illustrative. Other configurations of link runs and processing modalities are possible. For example, link banks and link runs may not be straight rows and may not be processed with continuous motion.

Minor changes in the optics path, e.g., tiny dimensional changes caused by thermal expansion or contraction, can significantly diminish desired properties of the focused laser beam spot.

In present semiconductor link processing systems, the laser beam is initially aligned and then occasionally re-aligned by a manual process that entails opening the system's enclosure and other shrouds or covers, running diagnostic tests to observe laser beam or laser spot properties, determining appropriate adjustment(s), and manually making those adjustments to adjustable optical elements in the laser beam path. This process is imperfect, time-consuming, and requires a skilled technician. For example, because the system's enclosure, shrouds, and covers are removed to make adjustments, the system is in a thermal state that is different from typical operating conditions. Because thermal conditions can affect laser beam alignment, the adjustment may be inherently inaccurate.

The use of lasers with high pulse repetition frequency (PRF) can exacerbate the alignment problem. While such lasers can result in increased processing throughput, they also introduce more heat into the system environment, inducing more thermal expansion and therefore more shifts to beam alignment. In addition, the inherent pointing stability and pulse stability characteristics of high PRF lasers is not always as good as lower PRF lasers. These factors combine to make beam alignment both more challenging and more critical in high PRF systems.

Other causes of misalignment include mechanical creep and failure, component movement due to motion and vibrations of the optics table, shock that occurs in shipment, components wearing out, debris landing on bearing surfaces, repeated heating and cooling cycles causing stresses that can induce a bolted-down component to reposition, and long-term changes of the laser and optical components caused by utilization. Any of these occurrences, and others not listed, can undesirably degrade system beam alignment.

As the features on semiconductor links continue to shrink, requiring a reduction in processing spot size, alignment tolerances will also reduce, making laser beam alignment more challenging.

SUMMARY OF THE DISCLOSURE

According to one embodiment, a method makes a discrete adjustment to static alignment of a laser beam in a machine for selectively irradiating conductive links on or within a semiconductor substrate using the laser beam. The laser beam propagates along a beam path having an axis extending from a laser to a laser beam spot at a location on or within the semiconductor substrate. The method generates, based on at least one measured characteristic of the laser beam, at least one signal to control an adjustable optical element of the machine effecting the laser beam path. The method also sends said at least one signal to the adjustable optical element. The method then adjusts the adjustable optical element in response to said at least one signal so as to improve static alignment of the laser beam path axis.

According to another embodiment, a machine selectively irradiates conductive links on or within a semiconductor substrate using a laser beam. The machine comprises a laser that generates the laser beam and a beam path along which the laser beam propagates. The beam path has an axis extending from the laser to a laser beam spot at a location on or within the semiconductor substrate, wherein the beam path is subject to one or more uncontrolled variations. The machine also comprises an adjustable optical element effecting the axis of the beam path and a processor electrically connected to the adjustable optical element and configured to generate, based on at least one measured characteristic of the laser beam, at least one electrical signal to adjust the adjustable optical element so as to compensate for at least one of said one or more uncontrolled variations and thereby to make a discrete improvement to static alignment of the beam path.

According to yet another embodiment, a system selectively irradiates structures on or within a semiconductor substrate using a plurality of laser beams. The structures are arranged in one or more rows extending in a generally lengthwise direction. The system comprises a laser source, a first laser beam propagation path, a first actuator, a second laser beam propagation path, a second actuator, and a control system. The laser source produces at least a first laser beam and a second laser beam. The first laser beam propagates toward the semiconductor substrate, along the first laser beam propagation path, which has a first laser beam axis that intersects the semiconductor substrate at a first spot. The first actuator is configured to adjust the first laser beam axis. The second laser beam propagates toward the semiconductor substrate along the second laser beam propagation path, which has a second laser beam axis that intersects the semiconductor substrate at a second spot. The second actuator is configured to adjust the second laser beam axis. The control system is configured to activate at least one of the first actuator and the second actuator so as to adjust at least one of the first and second laser beam propagation paths so as to improve alignment of at least one of the paths.

As used herein: the term "on" means not just directly on but atop, above, over, or covering, in any way, partially or fully; the term "substantially" is a broadening term that means about or approximately but does not imply a high degree of closeness.

Additional details concerning the construction and operation of particular embodiments are set forth in the following sections with reference to the below-listed drawings.

DETAILED DESCRIPTION OF EMBODIMENTS

A. Overview

With reference to the above-listed drawings, this section describes particular embodiments and their detailed construction and operation. The embodiments described herein are set forth by way of illustration only. Those skilled in the art will recognize in light of the teachings herein that variations can be made to the embodiments described herein and that other embodiments are possible. No attempt is made to exhaustively catalog all possible embodiments and all possible variations of the described embodiments. For the sake of clarity and conciseness, certain aspects of components or steps of certain embodiments are presented without undue detail where such detail would be apparent to those skilled in the art in light of the teachings herein and/or where such detail would obfuscate an understanding of more pertinent aspects of the embodiments.

As one skilled in the art will appreciate in light of this disclosure, certain embodiments are capable of achieving certain advantages over the known prior art, including some or all of the following: (1) superior alignment and resulting improved processing accuracy and improved laser spot quality; (2) faster alignment; (3) less disruption, particularly thermal and atmospheric disruption, to the machine; (4) alignment taking place in a thermal and atmospheric environment that is closed and therefore more stable and more closely resembles a processing environment; (5) decreased dependence on skilled technicians to manually make alignment adjustments; (6) relaxed requirements for system stiffness, vibration, and thermal stability; (7) more intuitive control of beam path alignment by automation of actuated adjustments, compared to manual component adjustments; (8) easier optimization of coordinated adjustments of multiple optical elements having an interdependent impact on beam alignment; and (9) improved control of alignment in multi-beam link processing systems and other complex optics layouts. These and other advantages of various embodiments will be apparent upon reading the remainder of this section.

Figure 4:
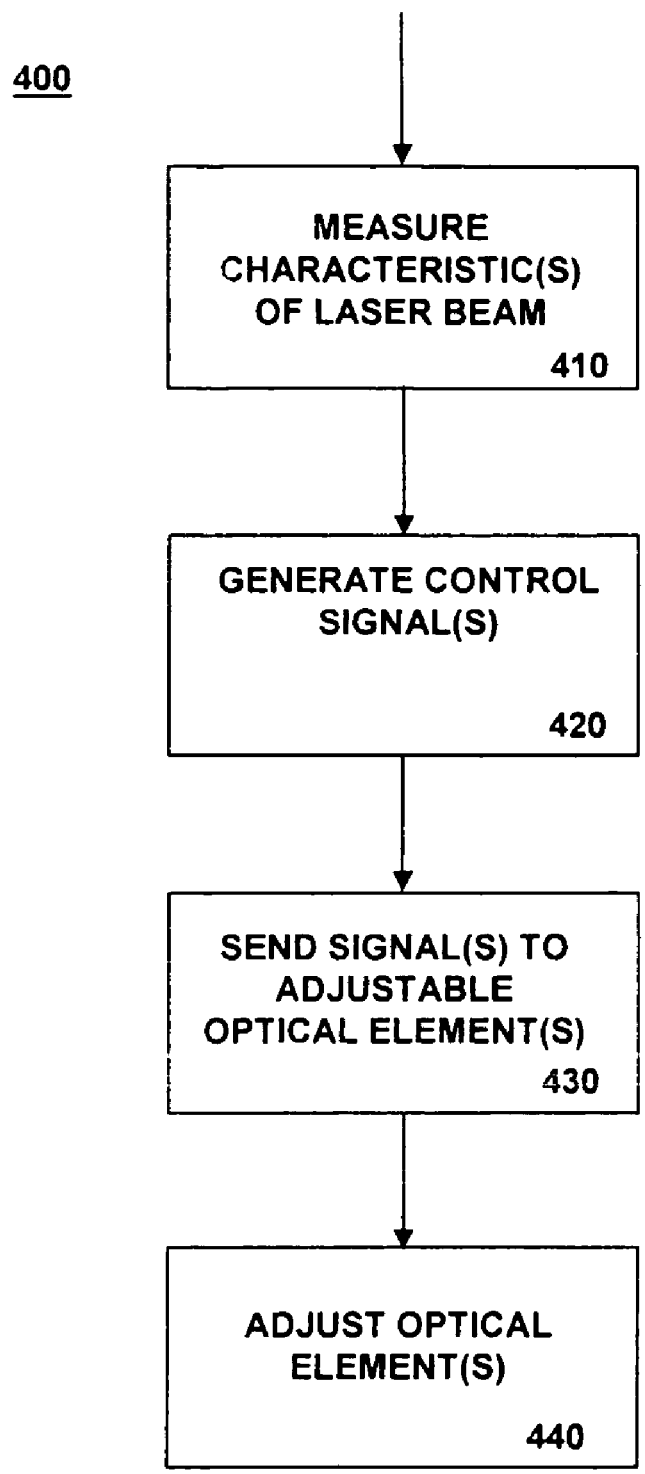
FIG. 4 is a flowchart of a method according to one embodiment.

FIG. 4 is a flowchart of a method 400 according to one embodiment. The method 400 measures (410) one or more characteristics of a laser beam, generates (420) a control signal based on the measured characteristic(s) and sends (430) the control signal to an adjustable optical element affecting the laser beam path. Responsive to the control signal, the method 400 adjusts (440) the adjustable optical element and thereby makes a discrete, static improvement to the alignment of the laser beam. As used herein, the term "alignment" in reference to a laser beam effects the axis of the propagation of the laser beam, and an alignment adjustment refers to any deliberate change in the laser beam path's axis to improve the beam path for the purpose of using the laser beam. Examples of alignment adjustments include changes to the pointing direction/slope and translation of the laser beam's axis to a new parallel placement.

The measuring step 410 is optional to the method 400, as the measurement may be known in advance or determined separately from the method 400. The measured beam characteristics may include, for example, spot location on the wafer 240 at the terminal end of the laser beam, location at an intermediary point along the laser beam path, beam path slope incident upon the wafer 240 or at an intermediary point, spot size, ellipticity, spot shape, astigmatism, beam waist shape, depth of focus, spot size adjustability, spot translation with spot size adjustment, spot translation with focus adjustment, cleanliness of a beam or spot, the presence of phantom spots, polarization, pulse energy, pulse power, attenuation, beam wave front distortion, and others. System diagnostic tests and other methods and instruments to measure these and other beam characteristics are known in the art. Particular techniques for measuring beam/spot location and slope on the wafer 240 and at intermediary points in the beam path are described in detail below.

Figure 1:
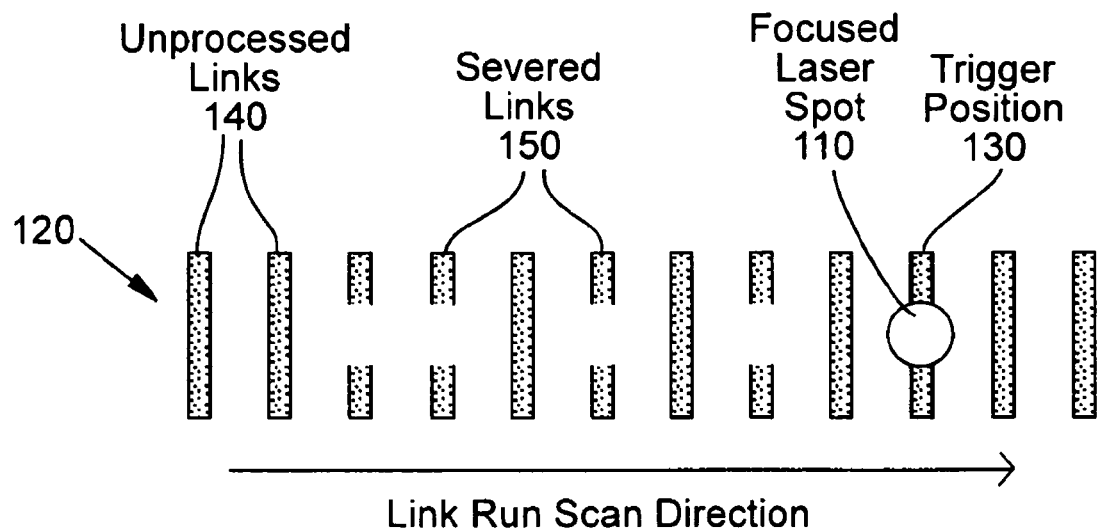
FIG. 1 is a diagram of a row or bank of links being selectively irradiated with a laser spot scanning along the lengthwise direction of the bank.
Figure 2:
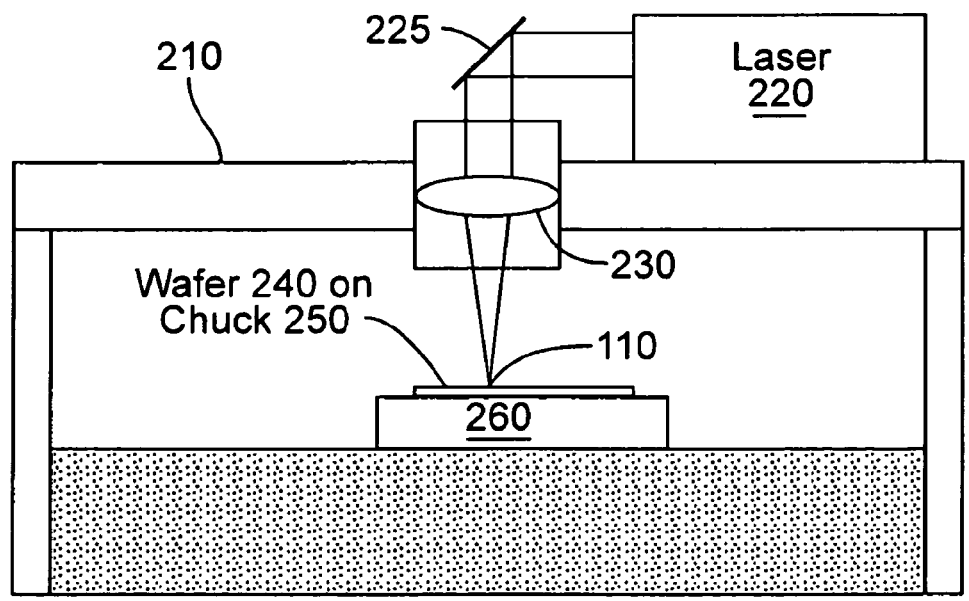
FIG. 2 is a diagram of a link processing system.
Figure 3A:
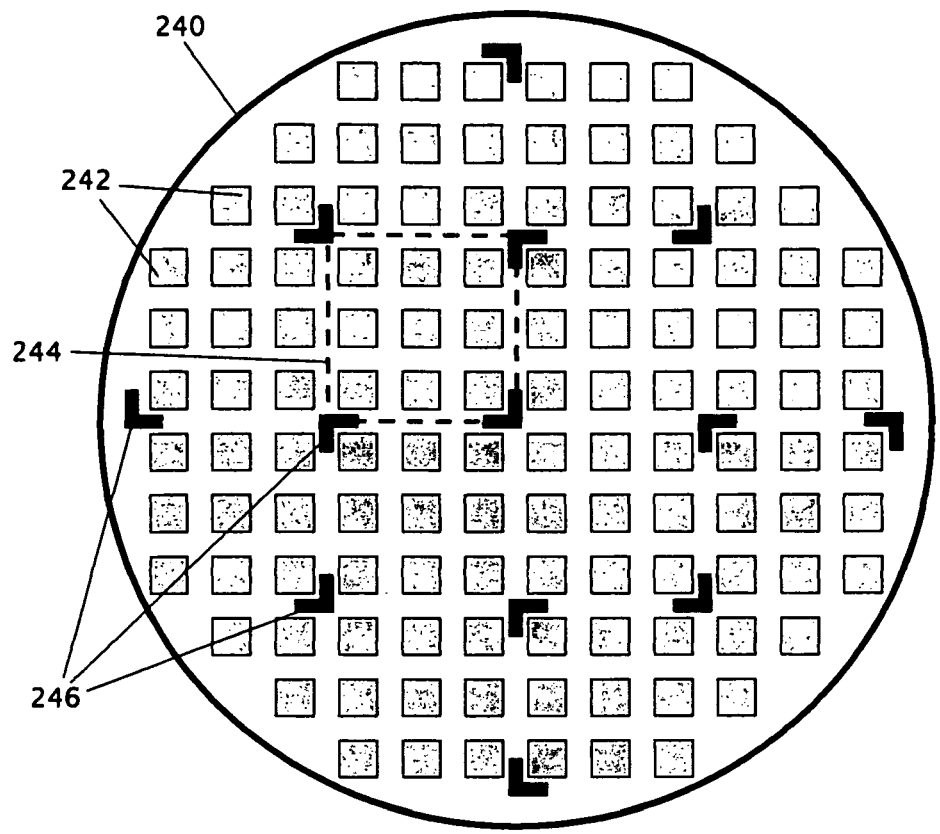
FIG. 3A is an illustration of a semiconductor wafer.
Figure 3B:
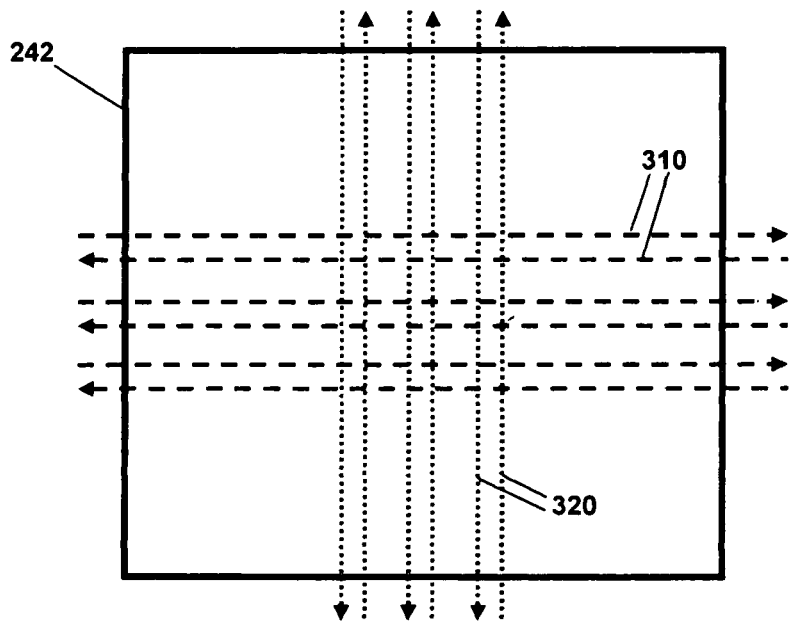
FIG. 3B is an illustration of link runs on a die on the semiconductor wafer of FIG. 3A.

One example of the measuring step 410 is scanning a laser beam spot across an alignment target, such as the alignment target 246 (as shown in FIG. 3A), on the wafer 240. By repeatedly scanning an alignment target at different focus depths, focus and/or beam slope information can be measured. Alternatively or additionally to the dedicated alignment targets 246, it is possible to utilize the links, such as the unprocessed links 140, within the dies 242 for alignment, as disclosed in U.S. patent application Ser. Nos. 11/213,329 and 11/365,468, both of which are incorporated by reference herein. Another example of the measuring step 410 is sensing the position of the laser beam at an intermediary point along the path using a beam splitter and a position sensitive detector (PSD) or quadrant photo detectors (sometimes called simply "quad detectors").

In addition to optical measurement of beam propagation properties, other types of sensors such as temperature or strain gauge sensors could be used to detect phenomena that affect beam path. For example, if strong correlation is found between beam path shifts and the temperature of components or the system environment, then beam shift compensation can be based upon these sensor measurements.

The measuring step 410 may be performed manually or automatically, in whole or in part.

The generating step 420 and the sending step 430 may entail generating and transmitting one or more signals to control one or more adjustable optical elements effecting the laser beam path. The signal(s) may be electrical signal(s) and/or another form (e.g., pneumatic, optical).

Responsive to the control signal(s), the method 400 adjusts (440) the adjustable optical element(s) so as to improve the alignment of the laser beam path, more particularly its axis. Examples of such adjustable optical elements include steerable mirrors (e.g., fast steering mirrors (FSMs)), steerable tilt plates, acousto-optic modulators (AOMs), acousto-optic deflectors (AODs), electro-optic modulators (EOMs), electro-optic deflectors (EODs), deformable mirrors, and the like. An adjustable optical element may comprise an actuator, such as a mechanical actuator. There are many commercially available off-the-shelf actuators. Some actuators involve motor driven or stepper motor driven screws, piezoelectric actuators, galvanometer devices, or voice coil motors. A number of manufacturers sell motorized translation stages, optic mounts, tilt plates, rotation stages, mirrors, and other components. One example of an actuated optic mount is the New Focus™ Picomotor™ actuated optic mount available from Bookham, Inc., San Jose, Calif. Those actuators can be used in both open- and close-loop configurations with different driver interfaces such as Ethernet, TTL (transistor transistor logic), or analog inputs. Other manufacturers such as Newport Corp., Irvine, Calif., offer similar products based upon other technologies such as direct piezoelectric drive, stepper motor drive, etc. Alternative actuators also include steering mirrors, such as those manufactured by Newport or Polytech PI, Karlsruhe, Germany, and galvanometer devices. Linear translation stages, rotation stages, and tilting stages can also be utilized for optics path adjustment.

Alignment and/or its improvement may be assessed according to a predetermined criteria. Examples of such criteria are the position of the beam's axis in some reference plane or its direction relative to the plane. One reference plane is that of the wafer 240, which is typically a planar object.

The method 400 is appropriate for occasional, discrete, one-off, open-loop, or off-line adjustments to the static alignment of a laser beam. In other words, the method 400 is preferably utilized for slow or low-frequency adjustments to the average, baseline, or DC alignment of a laser beam. Such adjustments typically occur in a short period of time, and then for a period of time there is no deliberate adjustments to the alignment. That said, a dynamic, closed loop, or continuous adjustment for a short time or a series of rather quick iterative adjustments may be "discrete" and "static," as those terms are used herein, on a larger time scale. Some illustrative possible times at which the method 400 may be performed are at system start-up or initialization; when a system parameter, such as spot size, changes; between processing intervals, such as between wafers, between X and Y link runs, between individual link runs, or between the processing of link run segments that require a different spacing; or periodically, such as, for example, not more than once per day, once per hour, or once per minute. In general, the time scale at which adjustments are made by operation of the method 400 is preferably similar to the time scale of thermal effects or other system disturbances that may cause misalignment.

The method 400 is typically performed when the machine is not performing link processing. The same adjustable optical components that are statically or discretely adjusted in step 440 may also be used to make dynamic or continuous adjustments to the laser beam path during processing or at other times. For example, U.S. Pat. No. 6,816,294 and U.S. patent application Ser. No. 10/985,840, which are incorporated herein by reference, disclose the use of a fast steering mirror (FSM) to implement on-the-fly corrections of trajectory of the laser spot 110 along the wafer 240 during a link run.

Determining what optical elements to adjust and the magnitude and polarity of the adjustment can be done in a number of ways. The problem may be a single-variable or a multivariate problem, depending on the number of measurable characteristics and the number of adjustable optical elements (which is the number of degrees of freedom). For any given pair of a measurable characteristic and an adjustable element, their relationship may be based on mathematical physical models, analytic equations, determined empirically, or learned by an adaptive or other learning system. Mathematical physical models or analytical equations may be derived from system configuration information and device data that is readily available from the manufacturer or measurable. A given measurable-characteristic-adjustable-element pair relationship and thus control or adjustment rule may be determined once and then assumed the same for all similar systems, or it may be machine specific and thus unique to each instance of a particular system, or it may even be dependent upon operating point.

In general, there are two aspects to any adjustment rule. One aspect is the relationship between the control signal for a given adjustable element and its adjustment. That relationship is usually specified by the element manufacturer or can be characterized by testing. The other aspect is how adjustment to the element affects the beam path. That may be determined by mathematical analysis of the system (e.g., analysis may reveal that a $+\alpha$ angular change to an adjustable mirror causes the spot size on the wafer to move $+\beta$ in the X direction on the wafer for a given system architecture). Alternatively, that relationship may be determined empirically by testing.

In a multivariate system with either multiple measurable characteristics or multiple adjustable degrees of freedom or both, analysis or testing can reveal which measurable characteristics are affected by which degrees of freedom and the nature of those relationships.

In a multivariate system, the relationships between measurable characteristics and adjustable degrees of freedom can be mathematically modeled as follows: $\Delta P_{sys}=T\Delta A_{pos}$ where $\Delta P_{sys}$, is a change in measurable characteristics from an initial state $P_{sys}^0$ (i.e., $P_{sys}=P_{sys}^0+\Delta P_{sys}$), $\Delta A_{pos}$ is a change in adjustable element state from an initial state $A_{pos}^0$ (i.e., $A_{pos}=A_{pos}^0+\Delta A_{pos}$), and T is a transformation matrix. $P_{sys}$ is a vector of the form $$P_{sys} = \begin{bmatrix} MC_1 \\ MC_2 \\ \vdots \\ MC_N \end{bmatrix} \quad (1)$$

where each element of this vector is a measurable characteristic. $A_{pos}$ is a vector of the form $$A_{pos} = \begin{bmatrix} AOEP_1 \\ AOEP_2 \\ \vdots \\ AOEP_M \end{bmatrix} \quad (2)$$

where each element of this vector is a controllable parameter or input to an adjustable optical element. The matrix T is an N by M matrix that can be predetermined by testing and/or analysis.

The foregoing mathematical model assumes linear relationships about the initial states $P_{sys}^0$ and $A_{pos}^0$. Finer accuracy can be achieved by utilizing multiple such linear models, each about different operating points. More generally, a non-linear model can be utilized.

Given a mathematical model, such as the one above, determining the adjustment to make reduces to solving the equation for $\Delta A_{pos}$ that yields a desired $\Delta P_{sys}$ for a given transformation matrix T. Any technique, of which many are known in the art, for solving such an equation can be utilized. For example, using an inverse or pseudo-inverse of T can yield a solution. One particular solution technique is to choose a solution that minimizes a cost function. Various cost functions are possible depending upon what one wants to penalize. Cost function contributors can penalize, for example, actuator offset from the position established by the last manual alignment, combinations that deviate from acceptable or desirable system limits, deviations from ideal settings (such as a beam hitting the center of a mirror or lens entrance pupil), or any other undesirable system property. Formulating a cost function for each individual contributor and summing all such cost functions for an overall cost function is straightforward. One possible formulation for an individual cost function is $$COST(x) = c \left| \frac{x - X_0}{R} \right|^P \quad (3)$$

where $X_0$ is a nominal or ideal (zero cost) value of x, R is a range, c is a scale factor, and P is a power. Different formulations are possible. Given a cost function, there are many well-known optimization techniques to determine a solution $\Delta A_{pos}$ that minimizes or approximately minimizes the cost function subject to the restraint that $\Delta P_{sys}=T\Delta A_{pos}$ be satisfied.

Once an adjustment relation or rule is known, it can be implemented by various techniques when the method 400 is performed, including computation or table look-up of pre-computed adjustment values for various cases.

One benefit of the method 400 is that it can be conveniently performed in a closed system under thermal conditions that are closer to operational processing conditions. By maintaining a closed system, the method 400 can also adjust alignment without disturbing atmospheric conditions, thereby enabling the use of sealed enclosures in the machine. Thus, a link processing machine, or a part thereof, may be sealed in a vacuum or inert gas (e.g., $N_2$) atmosphere, for example, and still be able to have its alignment adjustable.

It is also quicker, more convenient, and more reliable to make adjustments by a command signal rather than manual movements of optical elements by a technician. The method 400 may also be combined with manual adjustments. For example, an initial manual alignment can be performed, and the resulting positions of each adjustable optical element stored for future reference in case of a reset after a catastrophic system failure so that all elements can be returned to a state known to be good at one time. Automatic adjustments can thereafter be made.

The method 400 is applicable to systems that employ one or multiple laser beams. Both single-beam and multiple-beam systems may require alignment. In either case, the alignment of the laser beam path(s) may be adjusted during machine set-up and then not require further adjustment. However, there may be situations, such as to correct for thermal drift of focused spots, where static, periodic, or other beam adjustment (including dynamic beam adjustment in a multi-beam system) is desirable. Actuators may be placed in the system for beam adjustment actuators and a control system can be put in place for configuring these actuators based upon scan data from alignment targets or PSD measurements of beam position. Multiple-beam link processing systems are described more fully in application Ser. Nos. 60/580,917, Ser. Nos. 11/051,265, 11/051,262, 11/052,014, 11/051,500, 11/052,000, 11/051,263, 11/051,958, and 11/051,261, referenced above. The alignment needs of multiple-beam systems can be more demanding, not just because there are more beams to align, but also because maintaining a desired relation among multiple beams makes the alignment problem more challenging. What follows are some embodiments of the foregoing and related principles in single-beam and multiple-beam systems.

B. Single-Beam Systems

Figure 5:
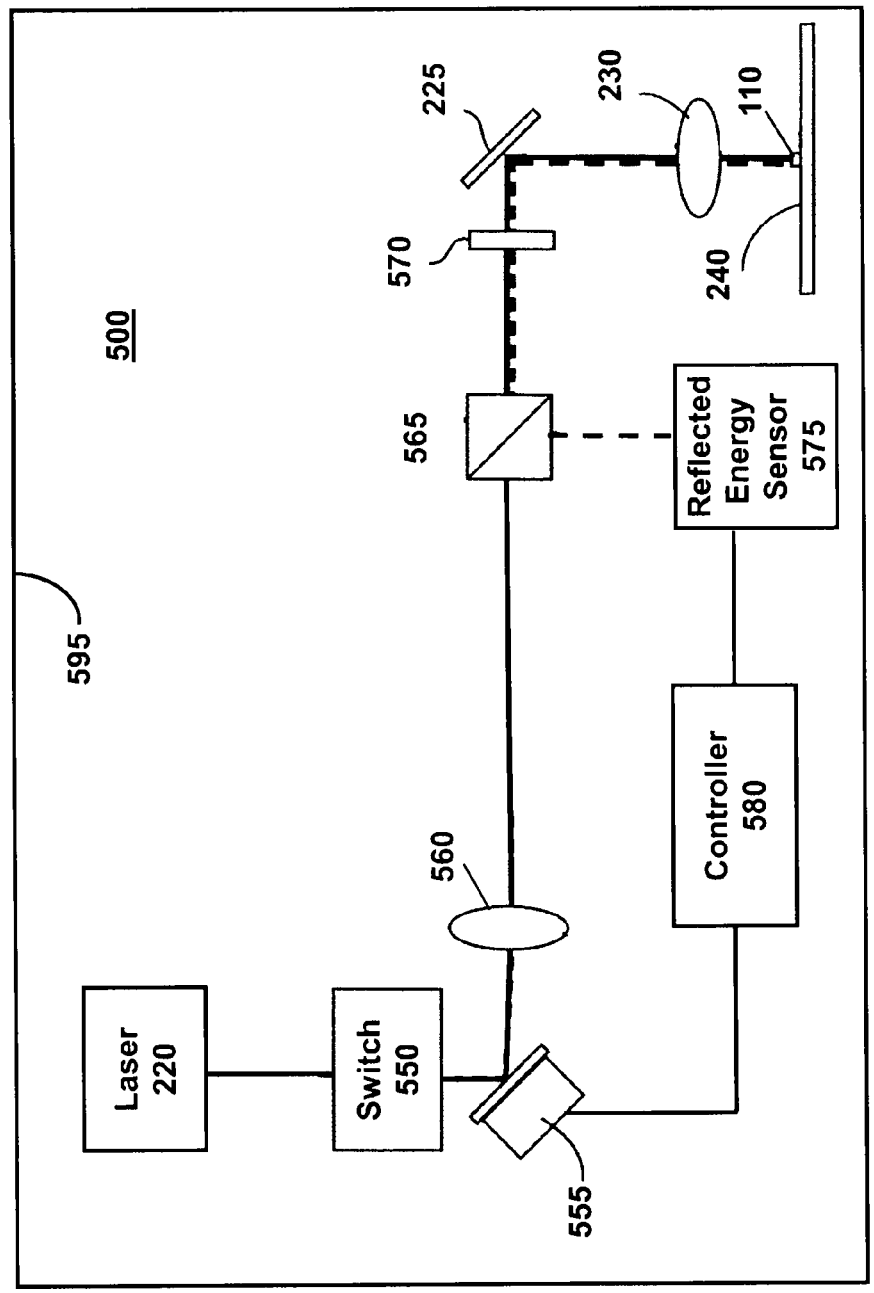
FIG. 5 is a block diagram of a single-beam link processing system with a beam alignment capability according to one embodiment.

FIG. 5 is a block diagram of a single-beam link processing system 500 with a beam alignment capability, according to one embodiment. The system 500 measures one or more spot locations or the incident slopes of a laser beam path 510 on the wafer 240 and controls one or more steerable mirrors accordingly to align the laser beam path 510. More specifically, the system 500 comprises the laser 220, which transmits the laser beam to a switch 550, which may be any optical shutter, such as an AOM, to selectively block or pass the laser beam to a first steerable mirror 555 then to a second steerable mirror 560. Preferably the mirrors 555 and 560 are steerable in two orthogonal axes, but they need not be. As the laser beam reflects off the mirror 560, it passes through a beam splitter 565 and a quarter-wave plate 570 before striking the final turn mirror 225. Other optics not illustrated may also be present. From the final turn mirror 225, the laser beam passes through the final focus lens 230 before striking the wafer 240 at a focused beam spot 110. A reflection off an alignment target or other reflective structure on the wafer 240 returns through the final focus lens 230, off the final turn mirror 225, through the quarter-wave plate 570, and into the beam splitter 565, which is configured to direct the reflected signal to a reflected energy sensor 575, which may be a photodetector, for example.

The beam splitter 565 and the reflected energy sensor 575 can be used during a measurement mode to collect reflected energy from the wafer 240 and to measure that energy. In a typical X or Y alignment scan (sometimes referred to as beam-to-work (BTW) scans), the laser beam spot 110 is scanned across an alignment feature on the wafer 240. The reflection off the wafer 240 is sensed by the reflected energy sensor 575, which conveys its readings to a controller 580. The reflected energy readings correspond to numerous position coordinates from a position sensor (not shown) or from position commands sent to the motion stage 260 (not shown in FIG. 5). Differences in the received reflected power when the laser spot falls upon the alignment feature, and the area surrounding the alignment feature, are interpreted by the controller 580, along with the position coordinates, to deduce the location of the alignment feature relative to the laser beam spot 110 in the coordinate system of the motion stage 260. Typically, the alignment feature is more highly reflective than the area surrounding the alignment feature, resulting in increased optical power received by the reflected energy sensor 575 when the laser beam spot 110 overlaps with the alignment feature. By scanning alignment features at more than one focus height, the slope of the beam 510 as it intersects the wafer 240 can be determined. If the beam 510 has a nonzero slope (zero is perpendicular to the plane of the wafer 240) then the feature will move laterally in the coordinate system of the system 500 as the focus height is changed.

Based on the beam slopes measured by the BTW scans, the controller 580 can calculate a desired adjustment to one or both of the steerable mirrors 555 and 560 to achieve or improve alignment according to some predetermined criteria, such as desired slope. The controller 580 sends an appropriate command signal to the steerable mirrors 555 and/or 560 to accomplish that adjustment. In an alternative embodiment, one or more adjustable tilt plates are incorporated in the beam path 510 and controlled instead. In yet another alternative, both steerable mirrors and steerable tilt plates are utilized and controlled. A given optic element may be adjustable in both X and Y directions, or two separate optic elements—one adjustable in the X direction only and one adjustable in the Y direction only—can be utilized to the same effect.

The controller 580 may be any form of controller or processor and is preferably a digital processor, such as a general-purpose microprocessor or a digital signal processor (DSP), for example. The controller 580 may be readily programmable by software; hard-wired, such as an application specific integrated circuit (ASIC); or programmable under special circumstances, such as a programmable logic array (PLA) or field programmable gate array (FPGA), for example. Program memory for the controller 580 may be integrated within the controller 580, or may be an external memory (not shown), or both. The controller 580 executes one or more programs or modules to perform various functions. The controller 580 may contain or execute other programs or modules (not shown), such as to control the motion stage 260 (not shown in FIG. 5), to control firing of the laser 220, and to control the state of the switch 550, to transfer data, to associate data from the various components together (preferably in a suitable data structure), to perform calculations using the data, to otherwise manipulate the data, and to present results to a user or another processor.

Figure 6A:
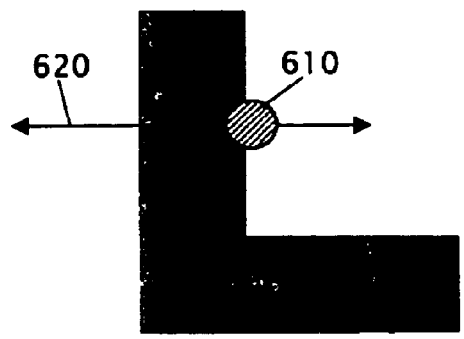
FIG. 6A is a plan view of an alignment target showing a laser beam spot, used to measure X position of the beam spot.
Figure 6B:
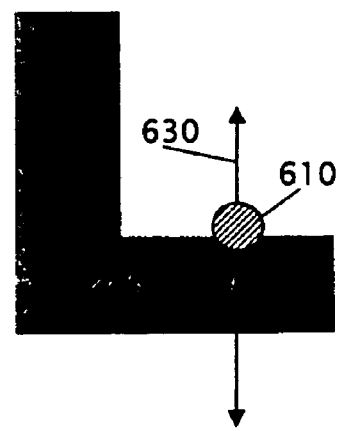
FIG. 6B is a plan view of an alignment target showing a laser beam spot, used to measure Y position of the beam spot.

FIGS. 6A and 6B illustrate BTW measurement scans in greater detail, using the alignment targets 246. In FIG. 6A, an alignment laser beam spot 610 traverses back and forth across the alignment target 246 in an X alignment path 620. The beam spot 610 traverses this path 620 back and forth at a number of different focusing heights, and the focusing height producing the sharpest edge transitions is used to register the edge positions of the alignment target 246. In FIG. 6B, the same process is repeated in the Y direction along a Y alignment path 630. The alignment laser beam spot 610 may or may not be the same as the processing laser beam spot 110. For example, the alignment laser beam may have reduced power compared to the processing laser beam, so as not to damage the alignment target 246 or surrounding material. As another example, the alignment laser beam may be a continuous-wave laser beam rather than a pulsed laser beam.

Figure 6C:
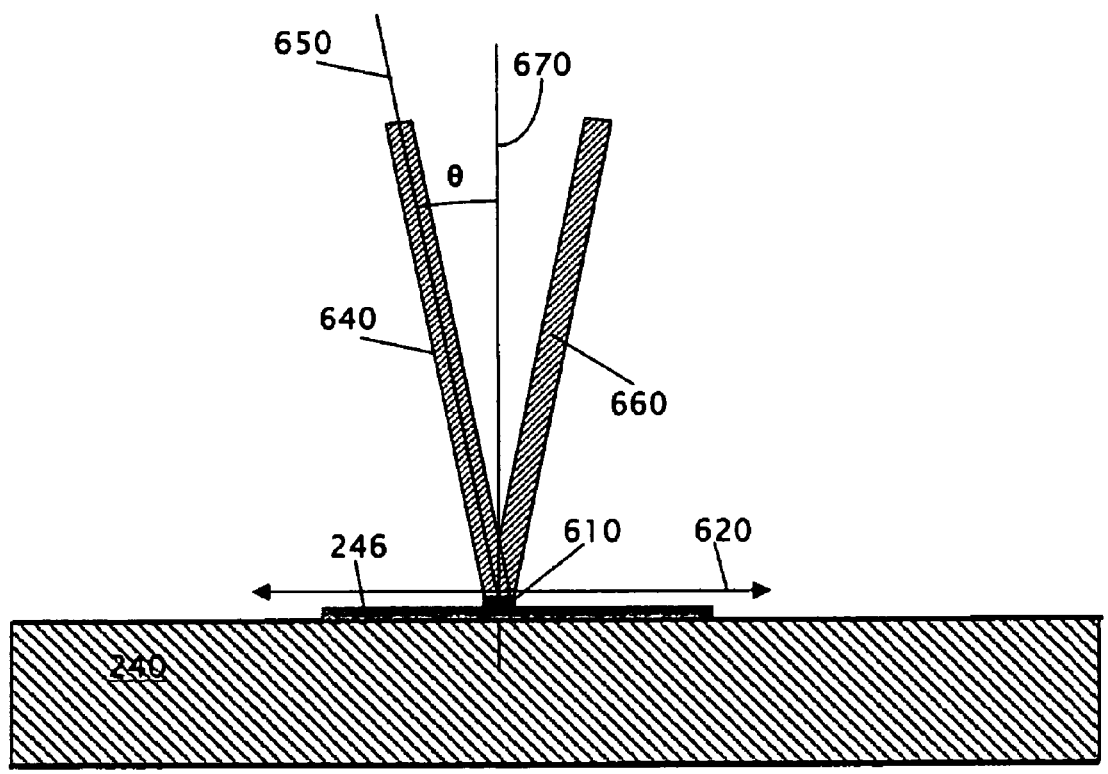
FIG. 6C is a side view of a laser beam incident on an alignment target used to measure incident beam slope.

FIG. 6C is a side view of FIG. 6A, showing how to measure incident beam slope. An alignment laser beam 640 propagates along an incident beam path axis 650 to the alignment beam spot 610, from which a reflected laser beam 660 is generated off the alignment target 246. The incident beam path axis 650 is angularly offset from a normal line 670 (normal to the plane of the wafer 240) by an angle $\theta$. As the alignment beam spot is swept across the alignment target 246 at a given focus height, the appearance and vanishing of the reflecting beam 660 signals the edges of the alignment target. When a sweep is repeated at a different focus height at the same beam slope $\theta$, the edges of the alignment target will appear and vanish at different X positions. The unknown beam slope can be calculated, based on the known focus height difference and X position differences, using well-known trigonometric relations.

Beam position and beam slope can be altered by various optical elements. Mirrors can cause a change in beam direction and beam slope. Tilt plates, which operate according to principles of refraction, ideally alter beam position but not direction in the sense that the beam path axis is translated to a parallel position by a tilt plate. A focusing lens, such as the final focus lens 230, transforms incoming beam slope differences into beam spot location differences, and vice versa. The system 500 can be utilized to make adjustments to either spot position or beam slope incident on the wafer 240 or both, but it is typically more useful to make adjustment for beam slope, as a single-beam system, such as the system 500, is less susceptible to pure translational beam spot misalignment because BTW scans and PGC are generally robust to pure positional beam spot misalignment.

Figure 7A:
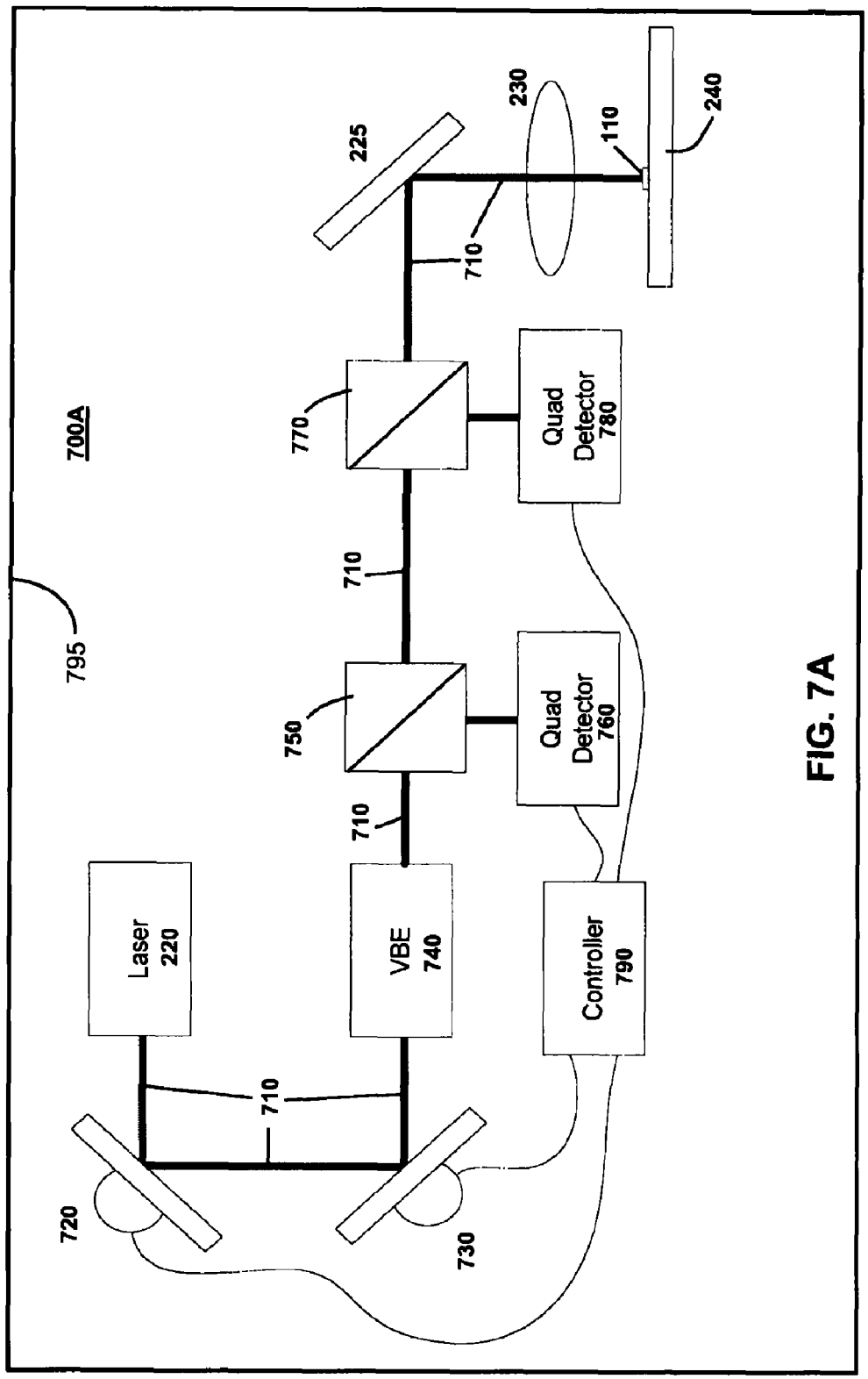
FIG. 7A is a block diagram of a single-beam link processing system with a beam alignment capability according to one embodiment.

FIG. 7A is a block diagram of a single-beam link processing system 700A with a beam alignment capability, according to another embodiment. The system 700A measures position characteristics of the laser beam at two different points along its laser beam propagation path. By measuring beam location along the path with position sensitive detectors, beam misalignment may be more quickly detected than using diagnostic BTW scans in some instances.

The system 700A comprises the laser 220, which generates a laser beam that propagates along a laser beam propagation path 710 having an axis that defines the beam path 710. The beam path 710 extends from the laser 220 to a variable beam expander ("VBE") 715 then a first motorized mirror 720 and a second motorized mirror 730. The first and second motorized mirrors 720 and 730 are adjustable so as to vary the beam path 710 (or its axis) based on the tilt angles of these mirrors. After the second turnable mirror 730, the beam path 710 enters a first beam splitter 750, which deflects a portion of the laser beam's energy to a first quad detector 760, which can measure the position of the laser beam at that point. From the first beam splitter 750, the laser beam path 710 extends to a second beam splitter 770, which deflect a portion of the beam's energy to a second quad detector 780. From the second beam splitter 770, the beam path 710 extends to the final turn mirror 225, the focus lens 230, and onto the wafer 240 at the focused laser beam spot 110.

The controller 790 acquires data from the quad detectors 760 and 780 and controls the motorized mirrors 720 and 730 based on that data. The controller 790 may be like the controller 580 in the system 500.

The VBE 715 can be adjusted to change the beam width and thus the spot size on the wafer 240. The VBE 715 is like a motorized telescope. An ideal VBE affects only beam width and not the axis of the laser beam path 710. However, due to real-world imperfections, a VBE adjustment can have minor, parasitic effects on orientation of the beam's axis. These effects are worse if the VBE 715 is poorly aligned. Ideally the system 700A should be aligned such that the beam does not wander over the entire range of VBE adjustability. That can place severe requirements on the precise placement of the VBE 715. The alignment techniques described herein can relax those requirements.

Figure 7B:
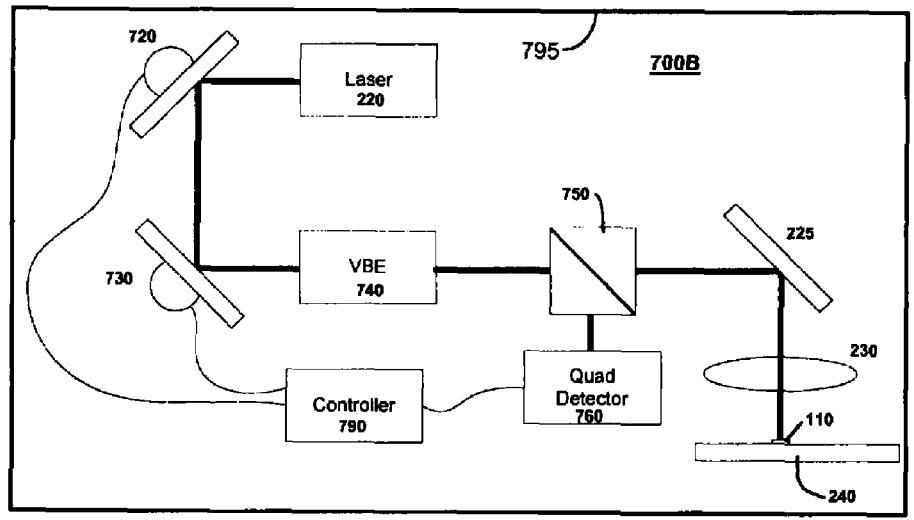
FIG. 7B is a block diagram of a single-beam link processing system with a beam alignment capability according to another embodiment.

FIG. 7B is a block diagram of a single-beam link processing system 700B with a beam alignment capability according to another embodiment. The system 700B is like the system 700A but without the second beam splitter 770 and the second quad detector 780. The system 700B can measure the position of the beam at one point along the beam path, whereas the system 700A can measure the position of the beam path 710 at two different locations and thereby also derive beam slope information.

Figure 7C:
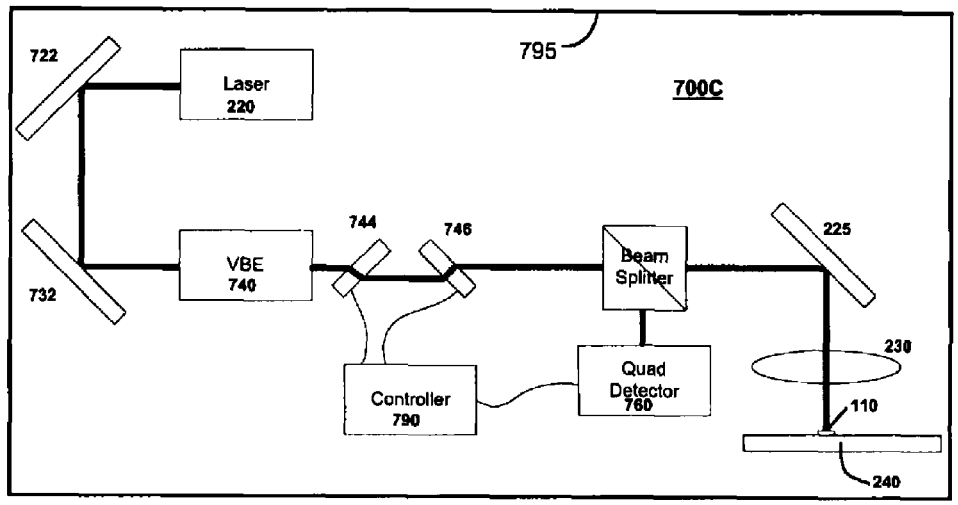
FIG. 7C is a block diagram of a single-beam link processing system with a beam alignment capability according to another embodiment.

FIG. 7C is a block diagram of a single-beam link processing system 700C with a beam alignment capability according to another embodiment. The system 700C differs from the system 700B in that fixed mirrors 722 and 732 are used in place of the motorized mirrors 720 and 730, and in that motorized tilt plates 744 and 746 are included. The tilt plates 744 and 746 may be made of glass or other transparent or semi-transparent material, for example.

The system 500 may also optionally comprise one or more covers, shrouds, enclosures or the like, such as an enclosure 595, as shown in FIG. 5 for the sake of illustration. Although the enclosure 595 is illustrated surrounding the entire system 500, one or more enclosures could alternatively or additionally cover just certain components or sets of components. As noted elsewhere in this document, the ability to perform an alignment operation without opening the enclosure can be advantageous because it can allow the alignment to be performed in a thermal and atmospheric environment more closely resembling operational conditions.

C. Multiple-Beam Systems

Figure 8:
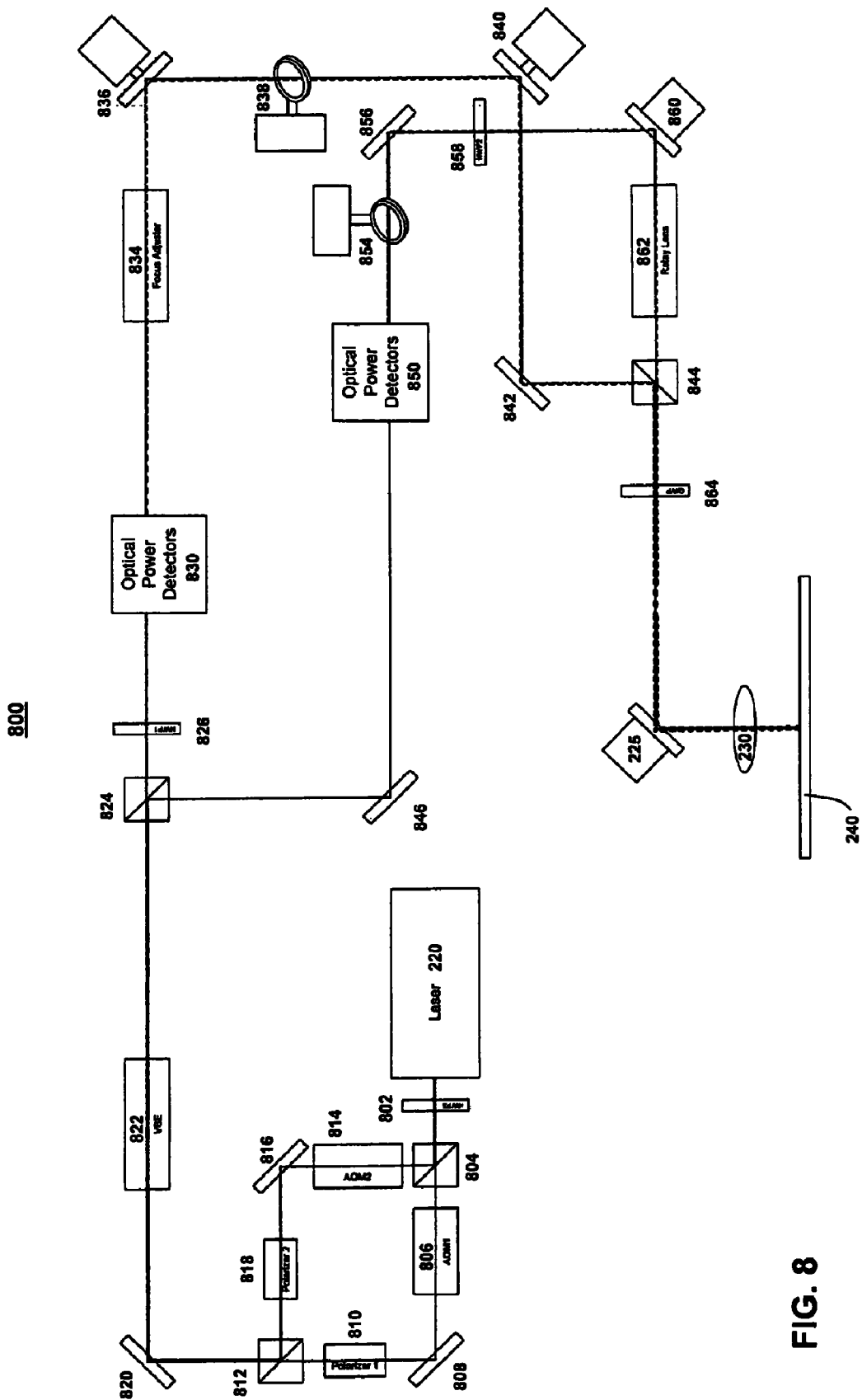
FIG. 8 is a block diagram of a dual-beam link processing optics system with a beam alignment capability according to one embodiment.

FIG. 8 is a block diagram of a dual-beam link processing optics system 800 with a beam alignment capability according to one embodiment. The system 800 comprises the laser 220, which generates a laser beam directed through a half-wave plate 802 and into a beam splitter 804. From one output of the beam splitter 804 a laser beam passes through an acousto-optic modulator ("AOM") 806, a mirror 808, and a polarizer 810 into a beam combiner 812. From the other output of the beam splitter 804 a laser beam passes through or off an AOM 814, a mirror 816, and a polarizer 818 into the beam combiner 812. From the beam combiner 812, the combined laser beams reflect off a mirror 820, then into a VBE 822 and a beam splitter 824. A first beam from the beam splitter 824 passes through a half-wave plate 826, an optical power detector 830, a focus adjuster 834, a first turnable mirror 836, a first adjustable tilt plate 838, a second turnable mirror 840, a mirror 842, and into a beam combiner 844. A second beam from the beam splitter 824 hits a mirror 846 and then passes through an optical power detector 850, a second adjustable tilt plate 854, onto a mirror 856, through a half-wave plate 858, into a third turnable mirror 860, through a relay lens 862, and into the beam combiner 844. Out of the beam combiner 844, the combined beams pass through a quarter-wave plate 864, off of the final mirror 225, through the final focus lens 230, and onto the wafer 240.

The system 800 is a split-recombine-split-recombine architecture. A first beam path passes off or though the components 220, 802, 804, 806, 808, 810, 812, 820, 822, 824, 826, 830, 834, 836, 838, 840, 842, 844, 864, 225, 230, and 240. A second beam path passes through or off the components 220, 802, 804, 814, 816, 818, 812, 820, 822, 824, 846, 850, 854, 856, 858, 860, 862, 844, 864, 225, 230, and 240. The system 800 utilizes a single laser 220, but an alternative embodiment could utilize two lasers.

The optical power detectors 830 and 850 include beam splitters and photo detectors for incident (shown in solid lines) pulse energy detection as well as reflected continuous-wave (shown in dashed lines) energy detection.

The turnable mirrors 836 and 840 in the first beam path are motorizied two-axis turn mirrors preferably used to perform discrete, static adjustments. The adjustable tilt plate 838 is a motorized two-axis tilt plate that can also be used to perform a discrete, static adjustment to the first beam path. These elements can be adjusted together so that the first beam path has a desired alignment with respect to the second beam path when the turnable mirrors 860 and 225 are in their zero (e.g., center) positions. For example, the turnable mirrors 836 and 840 and the adjustable tilt plate 838 can be adjusted to deliver the first laser beam spot at a desired position on the wafer with respect to the second laser beam spot and with a desired incident slope onto the wafer 240. Often, the desired spatial relationship between the two spots is precisely overlapping at the same spot, and the desired beam slope is normal to the plane of the wafer 240.

The adjustable tilt plate 854 can be used to adjust, for example, the slope of the second beam path incident on the wafer 240. In a multi-beam system in which the beams are steerable with respect to each other, differences in beam slope can make it difficult, if not impossible, to obtain a desired spatial arrangement of the multiple beam spots on the workpiece. Positional control of multiple beams is most convenient when all beams have a normal slope incident on the workpiece. For that reason, the system 800 includes the adjustable tilt plate 854 to independently adjust the slope of the second beam path. The tilt plate 854 affects where the second laser beam hits the focus lens 230 and therefore the beam slope incident on the wafer 240. The same is true for the adjustable tilt plate 838 in the first beam path, although the turnable mirrors 836 and 840 can also influence that first beam's slope. Desired adjustments in each beams position and slope relate to desired beam slopes and positions at the entrance pupil of the final focusing lens 230, which can then be related to required mirror or tilt plate adjustments via well-known principles of optics and geometry.

The turnable mirror 860 is preferably a motorized two-axis turn mirror such as an FSM or piezoelectric XY tip-tilt mirror. The turnable mirror 860 can be used to impart a desired offset to the second laser beam spot with respect to the first. The turnable mirror 860 typically has a limited range of adjustability, such as ±10 μm in each of the X and Y directions. The present inventors have observed that, in the absence of satisfactory alignment techniques, alignment drift can cause the two laser beam spots to be separated by a sufficient amount that the two beam spots cannot be brought into a desired arrangement with the limited range of the turnable mirror 860. The alignment techniques described herein are therefore especially useful in multi-beam systems such as the system 800.

The final turn mirror 225 is preferably a motorized two-axis turn mirror, such as an FSM or piezoelectric XY tip-tilt mirror, like the turnable mirror 860 but perhaps with a smaller range of adjustability. The final turn mirror 225 can be used to jointly steer both laser beam spots on the wafer 240.

The system 700A may also optionally comprise one or more covers, shrouds, enclosures or the like, such as an enclosure 795, as shown in FIG. 7A for the sake of illustration. Although the enclosure 795 is illustrated surrounding the entire system 700A, one or more enclosures could alternatively or additionally cover just certain components or sets of components. As noted elsewhere in this document, the ability to perform an alignment operation without opening the enclosure can be advantageous because it can allow the alignment to be performed in a thermal and atmospheric environment more closely resembling operational conditions.

A controller (not shown) controls the operation of the system 800, including adjustment of the tilt plates 838 and 854, the turnable mirrors 836 and 840 for static, discrete adjustments to laser beam alignment. This controller may control other aspects of the system 800 as well.

The variables from the system 800 can be stated in terms of equations (1) and (2), in which the vectors $P_{sys}$ and $A_{pos}$ for the system 800 can be defined as follows:

$$P_{sys} = \begin{bmatrix} AB\_Offset_x \\ AB\_Offset_y \\ AB\_Offset_z \\ A\_Slope_x \\ A\_Slope_y \\ B\_Slope_x \\ B\_Slope_y \end{bmatrix} \quad (4)$$

and $$A_{pos} = \begin{bmatrix} A\_Tilt\_Plate_x \\ A\_Tilt\_Plate_y \\ B\_Tilt\_Plate_x \\ B\_Tilt\_Plate_y \\ A\_Mirror_x \\ A\_Mirror_y \\ B\_Mirror_x \\ B\_Mirror_y \\ Focus1 \\ Focus2 \\ VBE \end{bmatrix} \quad (5)$$

Other terms can be added to $P_{sys}$, such as spot properties, and XY position of one or both spots. The corresponding transformation matrix T can be determined by, for example, measuring the system properties in the vector $P_{sys}$, with all actuators in vector $A_{pos}$ at their initial positions, moving one actuator at a time and re-measure the system properties, continuing for sufficiently small steps of each actuator position, and repeating this process for each actuator. As a mathematical simplification, independent optical element-measurement pairs can be decoupled and characterized individually, such as discussed in the previous paragraph.

The system 800 preferably is configured to perform an alignment check and, if necessary, an alignment adjustment whenever an adjustment is made to the VBE 822. The system 800 may also be programmed to perform an alignment check and, if necessary, an adjustment periodically every x hours, where x is a user-selected parameter. A typical value may be x=12 hours.

To focus in a multiple-spot or multiple-beam system, such as the system 800, a target may be scanned at several focus heights and measurements of contrast or the spot size at these focus heights are used to predict and iteratively refine the focused beam waist. Because a multiple-spot system involving a single lens has only one lens-to-link structure or alignment target separation at a time, it may be necessary to pre-align all of the focused spots of a multi-spot system so that they all have substantially the same focus height. One method for doing so involves directing multiple laser beams onto targets at one or more focus depths, taking focus depth measurements for the various beams, determining relative focus depth differences based on those focus depth measurements, and adjusting the laser beam's paths in response, preferably to reduce the relative focus depth differences. That process can be repeated iteratively or by means of a feedback control system to achieve relative focusing pre-alignment. Thereafter, focus in a live wafer processing environment can be accomplished using just one of the focused laser spots. Focusing may be accomplished with a single target in a focus field, or with multiple targets, such as three or four targets, in a focus field. Focus height distances at the XY locations positions within the focus fields are then computed from the focus heights at the different focus target locations.

Focus in a multiple-spot system, such as the system 800, may also be enhanced by use of a focus control optic, such as the focus adjuster 834, to offset one or more focused spot beam waists from other focused beam waists in the Z direction.

In addition to being a useful independent focus mechanism, a focus control optic, such as the focus adjuster 834, can impart a known Z focus offset of a focused beam waist relative to other spots to enhance the focus methodology. By scanning an alignment target with these two or more Z-offset spots, the Z direction that must be traveled to achieve focus is known. Three or more Z-offset spots can be used to predict not just the focus direction, but also the distance to focus.

In a multi-beam system having multiple final focus lenses, another focusing technique involves small range of travel focus adjustors on each lens and a single coarse Z adjustment that can be aligned to approximately one wafer thickness and locked in place. This is preferably implemented on a system with a substantially flat and level chuck so that the lenses do not have to be shifted up and down to correct for wafer tilt while processing link runs. This greatly reduces the amount of focusing work that must be done. Focus then only has to track small (generally less than about 10 µm) deviations that occur due to wafer thickness variations, chuck topology variations, particles between the wafer and the chuck, and the like. Because each lens may focus upon a different part of the chuck, a piezoelectric actuator can be implemented on each lens to allow it to be moved vertically by a small amount to adjust focus. Focus can be adjusted by these piezo actuators so that the focused beam waist tracks the local wafer topology under each lens. Of course, alternative implementations of this focusing technique are possible such as using voice-coil or other actuators rather than piezoelectric actuators.

One alignment procedure for a multiple-spot system, such as the system 800, involves determining the position of all the spots relative to alignment targets and also any Z height dependency of this relationship. In the simplest implementation, an XY alignment target is first scanned and measured by all of the spots in the system to determine the XY and potentially Z offsets of these spots relative to one another. Then, the relative offsets may also be measured at different focus heights. This procedure may be performed on a single target, or many focus targets at different locations on the wafer, or on a calibration grid. The information gathered about the relative positioning of the spots at workpiece processing locations can be processed by one or more computers controlling the machine to calibrate and correct for differences in spot locations when processing different areas of the wafer.

Having characterized the multiple spots relative to one another, wafer XY alignment in different alignment fields can be implemented in a manner analogous to the single-spot system alignment. A target or targets can be scanned to determine the geometric relationship between a focused spot and the target link structures, and a known mapping between the spot locations can be applied to precisely determine the position of the rest of the system's focused spots. Then the XY beam steering mechanisms and focus offset mechanisms can be sent positioning commands to precisely position all of the focused laser spots at the desired locations for link runs and link run segments. This is preferably carried out by creating three-dimensional reference surfaces which define laser-to-workpiece calibrations in a region of the workpiece. Target link coordinates and the trajectory commands of stages, beam steering mechanisms, and focus offset mechanisms can be generated from CAD data of link blow locations, the reference surfaces, and any additional calibration information.

Some XY and focus calibration can be performed with only one of multiple spots on at a time. However there are other procedures where it is advantageous to scan targets with multiple spots that are simultaneously delivered. For example, scanning an XY alignment target using all of the spots at the same time can verify that all spots are focused and that the relative offsets between spots have been removed with the XY beam steering mechanisms through the calibration procedure. Reflection signals off of the scanned target would then appear to have the reflection signature of a single spot of tight focus. If any of the beams are not properly aligned or are out of focus, then multiple possibly overlapping reflection signatures will be observed, or the reflection signature of large spots superimposed with small spots may be observed.

Figure 9:
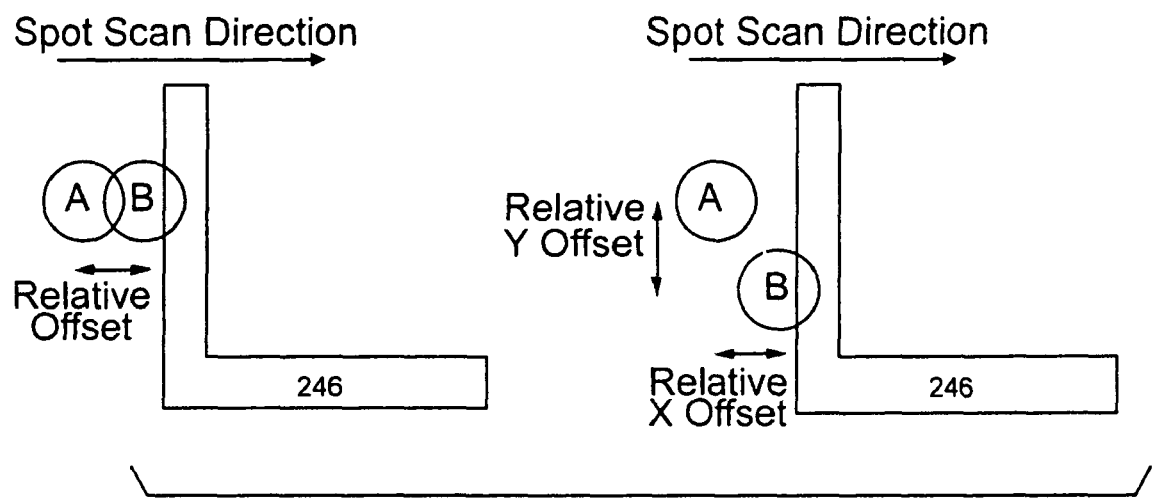
FIG. 9 is a plan view of an alignment target showing two laser beam spots, used to measure XY positions and/or relative offset.

Another calibration procedure using multiple spots simultaneously delivered to the wafer uses an averaging technique to improve the quality of scan measurements. This technique is illustrated in FIG. 9, which illustrates how BTW scans can be performed using a dual-beam system, such as the system 800, and its two laser beams spots, which are denoted "A" and "B." FIG. 9 is a plan view of the alignment target 246 showing the two laser beam spots A and B, used to measure X positions and/or relative offset. If the offset relationship between two spots is known and can be precisely set, then two (or more) spots can be set up to have a small lateral offset (e.g., a couple microns) along the axis that an alignment target 246 will be scanned (the X direction as shown in FIG. 9). Then a single scan of the alignment target, collecting reflected sensor data and stage position data, can be used to determine the locations of the two spots. This information can be combined with the commanded spot offsets to determine the target location with enhanced accuracy by averaging the two spot locations. This technique can be used to refine the accuracy of the spots relative to one another in the scan direction. As an example, assume that the offset distance in the scan direction is 5 µm. Assume further that scanning of spot 1 over the alignment target 810 produces a maximum reflection intensity when the X position is 10,005.020 µm, and that scanning of spot 2 over the alignment target 810 produces a maximum reflection intensity when the X position is 10,000.000 µm. Then, after taking into account the known offset and then averaging the two position measurements, the resulting position would be 10,000.010 µm. Because that average is based on more data than a single measurement, it is a more reliable result.

In a system that can determine which reflections were caused by which incident focused spot, it is possible to practice this averaging procedure with fully overlapping spots. Time slicing and exploiting different spot properties such as polarization or wavelength are some techniques by which a reflected spot can be associated with an incident spot. These techniques may be useful when the spots are partially overlapping or fully overlapping such that the relative offset is zero.

In the second case depicted in FIG. 9, the two scanned spots A and B have both on-axis and cross-axis offset. That provides two estimates of the location of the alignment target 246 with measurements made at different points along the alignment target 246. These multiple measurements are useful for determining absolute positioning on the wafer even when the alignment target 246 is not uniform or imperfect.

Next, since the beams of a multiple spot system may be equipped with real-time XY beam steering mechanisms, such as the turnable mirror 860 or the final turn mirror 225, these mechanisms, rather than the XY stage, may be used to scan the focused spots across alignment targets 246. Then the calibration routine correlates reflected signal energy off of alignment targets 246 with the sensed XY beam steering mechanism position and combines this with the XY stage position to determine spot positioning. Since independent XY beam steering mechanisms can be put in each of the beam paths, it is possible to independently scan XY alignment targets 246 with different focused spots. One target can be scanned in X while another alignment target 246 is scanned in Y with an appropriate method for determining which is the X signal and which is the Y signal. This can be done by dithering the power in the spots at specific frequencies using an AOM or other attenuator to change the energy, and then using the frequency information to determine which reflected signal comes from each spot. Alternatively, scanning the alignment targets 246 with spots moving at different velocities can be used to associate components of a reflection signal with a specific spot. Spots can be also be time-sliced or modulated at a high rate such that only one spot is on at time. Then reflection signals can be directly separated using time slices to allow scanning multiple targets, or an X and a Y target simultaneously. Time slicing can allow the system to align to targets with two reflected signal detectors (one for each beam) or with just one reflected signal detector that captures reflected energy from either spot. Separation based upon an optical property such as polarization or wavelength may also be appropriate for some implementations.

If multiple laser sources are used on a semiconductor link processing system, proper alignment will result in the highest quality link processing. One technique for alignment of multiple laser heads entails producing continuous wave or pulsed emissions from laser heads, measuring the propagation of beams relative to one another, and adjusting the beams to a desired overlap or relative position. Measuring the beams relative to one another may be done by scanning alignment targets 246 on wafers using the focused laser spots or it may involve placing PSDs or other optical detectors in the beam paths at different locations. An alternate technique is to place a PSD alignment tool into the beam path in place of the final focusing lens 230. Then beam positions can be measured while using the Z stage to change the position of the PSD, and optical elements, such as tilt plates and mirrors can be adjusted to correct beam positions. Measurement of beam or focused spot location may occur with all of the laser heads emitting individually or simultaneously.

One desirable beam alignment is such that the emissions from each laser head precisely overlap. Thus, the resulting single-beam system would have focused beam waists in the same position regardless of which laser head produced the pulse. Likewise, a two-beam system would produce two focused spots at the same locations regardless of which laser head produced the pulse.

Another desirable beam alignment is to introduce an intentional on-axis and/or cross-axis relative offset of the focused spots produced by different laser heads. Such an offset may be implemented so that pulses from one laser head impinge upon one row of links while pulses from other laser heads impinge upon other rows of links.

Actuators in the beam paths of a multi-beam system, such as the system 800, may also be used to reconfigure the alignment of beams produced by the different laser heads at times during or between wafer processing. For example it may be desirable to shift the positions of focused spots emanating from different laser heads between the processing of X and Y axis link runs, or between the processing of link run segments that require a different spacing. Furthermore, when processing with multiple spots through the same lens, it may be desirable to make small adjustments in the relative or absolute positions of the spots throughout a link run. For instance, there may be some dependency of focused spot XY position based upon Z height. If the beams are sloped, focusing at a different height due to a sloped chuck or changes in chuck and wafer topology may cause the spots to wander. Such errors can be corrected by using multiple beam actuators and/or beam steering mechanisms, such as mirrors, tilt plates, AOMs, EOMs, and the like. Such actuators may be mechanically, electrically, or otherwise activated.

Figure 10:
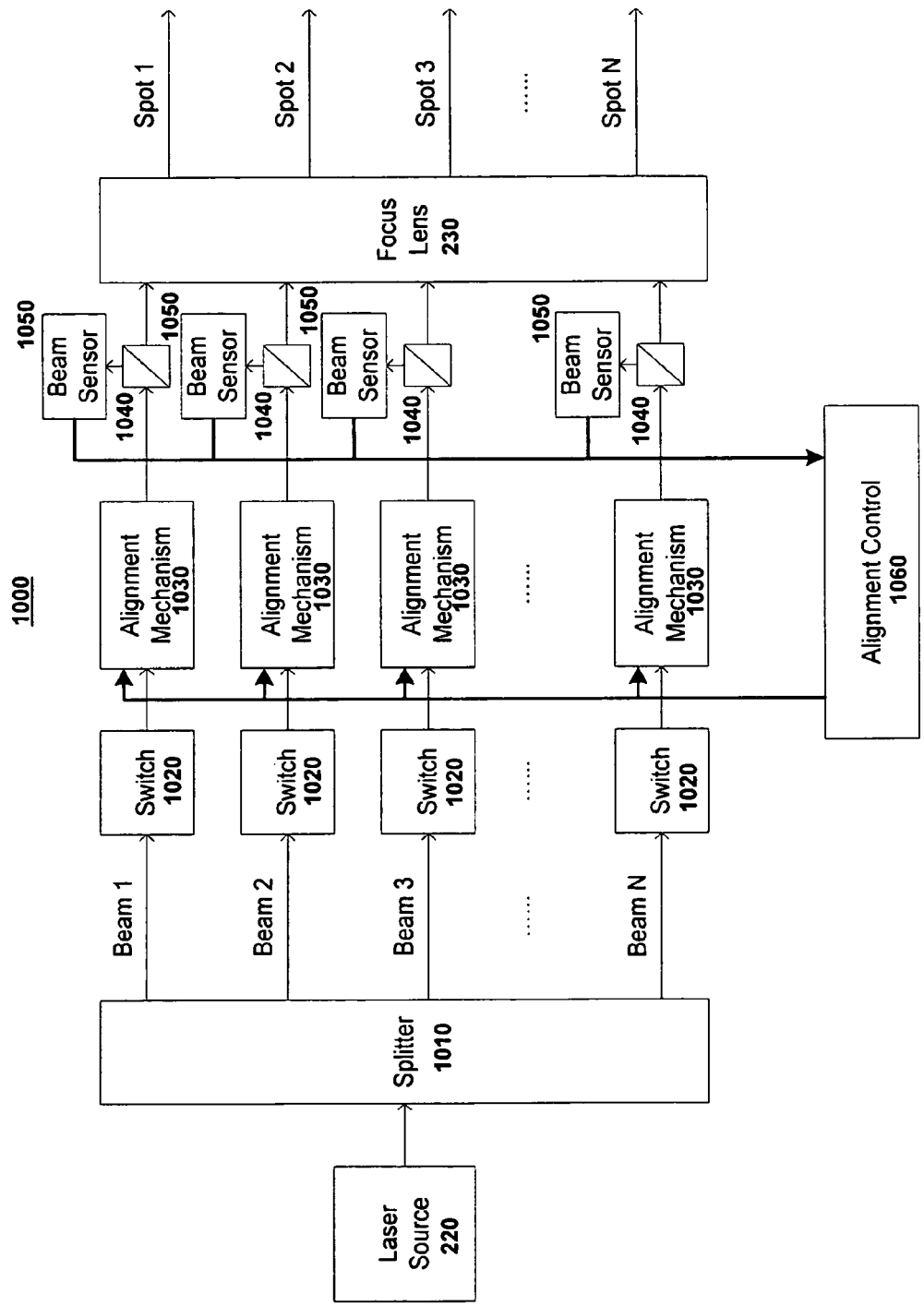
FIG. 10 is a block diagram of a N-beam link processing system with a beam alignment capability according to one embodiment.

Another multi-beam system architecture is illustrated in FIG. 10, which is a block diagram of a N-beam link processing system 1000 with a beam alignment capability according to one embodiment. The system 1000 comprises the laser source 220, which generates a laser beam; an N-way beam splitter 1010, which splits the laser beam into N different beams; and N switches 1020, which function as optical shutters to selectively block or pass the N beams, respectively. Also in each beam path is an alignment mechanism 1030, which may be a tilt plate, mirror, or the like. Each beam output from an alignment mechanism 1030 is incident on a beam splitter 1040, which passes a portion of the laser beam to the focus lens 230 and diverts a portion of the laser beam to a respective beam sensor 1050, which may be PSD, quad detector or the like. The data sensed by the beam sensors 1050 are acquired by an alignment control module 1060, which commands the alignment mechanisms 1030 accordingly. Note that an alternative to the single laser source 220 and the N-way beam splitter 1010 is N distinct laser sources.

The system 1000 senses beam alignment at respective intermediary points along each laser beam path. Alternatively, the system can be configured to sense beam alignment at the beams' terminal points by sensing a reflection off the wafer or other workpiece on which the laser beam spots lie, as previously described.

The methods and systems illustrated and described herein can exist in a variety of forms both active and inactive. For example, they can exist as one or more software, firmware, or other programs comprised of program instructions in source code, object code, executable code or other formats. Any of the above formats can be embodied on a computer-readable medium, which include storage devices and signals, in compressed or uncompressed form. Exemplary computer-readable storage devices include conventional computer system RAM (random access memory), ROM (read only memory), EPROM (erasable, programmable ROM), EEPROM (electrically erasable, programmable ROM), flash memory and magnetic or optical disks or tapes. Exemplary computer-readable signals, whether modulated using a carrier or not, are signals that a computer system hosting or running a computer program can be configured to access, including signals downloaded through the Internet or other networks. Concrete examples of the foregoing include distribution of software on a CD ROM or via Internet download. In a sense, the Internet itself, as an abstract entity, is a computer-readable medium. The same is true of computer networks in general.

For example, the method 400 can be performed by software executing on a processor or controller such as the controller 580, 790, or 1060. That software can present a user interface to a human operator, who may initiate an adjustment procedure or read logs of historical alignment operations.

The terms and descriptions used above are set forth by way of illustration only and are not meant as limitations. Those skilled in the art will recognize that many variations can be made to the details of the above-described embodiments without departing from the underlying principles of the invention. For example, the principles, methods, machines and systems disclosed herein have general applicability for processing any structure on or within a semiconductor substrate using laser radiation for any purpose. While the examples and embodiments that follow are described in the context in which those structures are laser-severable links on or within an IC (e.g., memory device, logic device, optical or optoelectronic device including LEDs, and microwave or RF devices), other structures besides laser-severable links can be processed in the same or similar manner, and the teachings set forth herein are equally applicable to the laser processing of other types of structures, such as electrical structures that become conductive as a result of laser radiation, other electrical structures, optical or electro-optical structures, and mechanical or electro-mechanical structures (e.g., MEMS (micro electromechanical structures) or MOEMS (micro opto-electro-mechanical structures)). As another example, not all link processing is for the purpose of severing a link so it does not conduct; sometimes the purpose of the laser radiation is to sever, cleave, make, heat, alter, diffuse, anneal, drill, trim, route, or measure a structure or its material. For example, laser radiation can induce a state change in a structure's material, cause the migration of dopants, or alter magnetic properties—any of which could be used to connect, disconnect, tune, modify, or repair electrical circuitry or other structures. The scope of the invention should therefore be determined only by the following claims—and their equivalents—in which all terms are to be understood in their broadest reasonable sense unless otherwise indicated.

The invention claimed is:

1. A method for making a discrete adjustment to static alignment of a laser beam in a machine for selectively irradiating conductive links on or within a semiconductor substrate using the laser beam, the laser beam propagating along a beam path having an axis extending from a laser to a laser beam spot at a location on or within the semiconductor substrate, the method comprising:
generating, based on at least one measured characteristic of the laser beam, at least one signal to control an adjustable optical element of the machine effecting the laser beam path;
sending said at least one signal to the adjustable optical element; and
adjusting the adjustable optical element in response to said at least one signal and thereby altering the laser beam path axis so as to improve static alignment of the laser beam path, wherein the laser beam path is aligned on a dimensional scale comparable to the conductive links on or within the semiconductor substrate such that the laser beam can irradiate selected conductive links.

2. The method of claim 1, further comprising:
measuring the measured characteristic automatically by the machine.

3. The method of claim 1, wherein the measured characteristic is measured manually by a person operating the machine.

4. A method according to claim 1, wherein said at least one measured characteristic comprises a position of the laser beam spot on or within the semiconductor substrate.

5. A method according to claim 4, further comprising:
scanning the laser beam spot over an alignment target on or within the semiconductor substrate; and
detecting a reflection of the laser beam off the alignment target.

6. A method according to claim 1, wherein the machine comprises an enclosure covering at least a portion of the beam path, and the adjusting step is performed without removing the enclosure.

7. A method according to claim 1, wherein the conductive links are laser-severable conductive links that are severed and thereby made non-conductive when irradiated with the laser beam.

8. A method according to claim 1, wherein the static alignment of the laser beam path is improved according to a predetermined criteria.

9. A method according to claim 1, wherein the machine is characterized by a thermal state associated with its operation to selectively irradiate structures on or within a planar semiconductor substrate using the laser beam, and the method is performed while the machine is at least approximately in said thermal state.

10. A method according to claim 1, wherein the adjustable optical element comprises a mirror and an actuator, wherein the actuator is configured to adjust an angle at which the mirror is oriented.

11. A method according to claim 1, wherein the adjustable optical element comprises an optical tilt plate and an actuator, wherein the actuator is configured to adjust an angle at which the tilt plate is oriented.

12. A method according to claim 1, wherein the adjustable optical element is selected from the group consisting of an acoustic-optic modulator, acoustic-optic deflector, electro-optic modulator, electro-optic deflector, and deformable mirror.

13. A method according to claim 1, wherein the adjustable optical element comprises an actuator receiving said at least one signal, and an optical element connected to the actuator.

14. A method according to claim 1, further comprising:
continuously and dynamically adjusting the adjustable optical element.

15. A method according to claim 1, wherein the adjustment is an open-loop adjustment.

16. A method according to claim 1, wherein the adjustment is made when the machine is not selectively irradiating conductive links.

17. A non-transitory computer-readable medium on which is embedded program instructions, which when executed on a processor in a machine cause the machine to perform a method for making a discrete adjustment to static alignment of a laser beam used by the machine to selectively irradiate conductive links on or within a semiconductor substrate using the laser beam, the laser beam propagating along a beam path having an axis extending from a laser to a laser beam spot at a location on or within the semiconductor substrate, the method comprising:
generating, based on at least one measured characteristic of the laser beam, at least one signal to control an adjustable optical element of the machine effecting the laser beam path;
sending said at least one signal to the adjustable optical element; and
adjusting the adjustable optical element in response to said at least one signal so as to improve static alignment of the laser beam path axis, wherein the laser beam path is aligned on a dimensional scale comparable to the conductive links on or within the semiconductor substrate such that the laser beam can irradiate selected conductive links.

18. A system for making a discrete adjustment to static alignment of a laser beam in a machine for selectively irradiating conductive links on or within a semiconductor substrate using the laser beam, the laser beam propagating along a beam path having an axis extending from a laser to a laser beam spot at a location on or within the semiconductor substrate, the system comprising:

a means for generating, based on at least one measured characteristic of the laser beam, at least one signal to control an optical element of the machine effecting the laser beam path; and a means for adjusting the optical element in response to said at least one signal so as to improve static alignment of the laser beam path, wherein the laser beam path is aligned on a dimensional scale comparable to the conductive links on or within the semiconductor substrate such that the laser beam can irradiate selected conductive links.

19. A non-transitory computer-readable medium on which is embedded program instructions, which when executed on a processor in a machine cause the machine to perform a method for making a discrete adjustment to static alignment of a laser beam used by the machine to selectively irradiate conductive links on or within a semiconductor substrate using the laser beam, the laser beam propagating along a beam path having an axis extending from a laser to a laser beam spot at a location on or within the semiconductor substrate, the method comprising:

generating, based on at least one measured characteristic of the laser beam, at least one signal to control an adjustable optical element of the machine effecting the laser beam path;

sending said at least one signal to the adjustable optical element; and adjusting the adjustable optical element in response to said at least one signal so as to improve static alignment of the laser beam path axis;

wherein said at least one measured characteristic comprises a slope at which the laser beam is incident upon the semiconductor substrate.

20. A system for making a discrete adjustment to static alignment of a laser beam in a machine for selectively irradiating conductive links on or within a semiconductor substrate using the laser beam, the laser beam propagating along a beam path having an axis extending from a laser to a laser beam spot at a location on or within the semiconductor substrate, the system comprising:

a means for generating, based on at least one measured characteristic of the laser beam, at least one signal to control an optical element of the machine effecting the laser beam path; and a means for adjusting the optical element in response to said at least one signal so as to improve static alignment of the laser beam path;

wherein said at least one measured characteristic comprises a slope at which the laser beam is incident upon the semiconductor substrate.

21. A method for making a discrete adjustment to static alignment of a laser beam in a machine for selectively irradiating conductive links on or within a semiconductor substrate using the laser beam, the laser beam propagating along a beam path having an axis extending from a laser to a laser beam spot at a location on or within the semiconductor substrate, the method comprising:

generating, based on at least one measured characteristic of the laser beam, at least one signal to control an adjustable optical element of the machine effecting the laser beam path;

sending said at least one signal to the adjustable optical element; and adjusting the adjustable optical element in response to said at least one signal and thereby altering the laser beam path axis so as to improve static alignment of the laser beam path;

wherein said at least one measured characteristic comprises a slope at which the laser beam is incident upon the semiconductor substrate.

22. The method of claim 21, further comprising:
measuring the measured characteristic automatically by the machine.

23. The method of claim 21, wherein the measured characteristic is measured manually by a person operating the machine.

24. A method according to claim 21, further comprising:
scanning the laser beam spot at a first focus height over an alignment target on or within the semiconductor substrate;
detecting a first reflection pattern of the laser beam off the alignment target at the first focus height;
scanning the laser beam spot at a second focus height over an alignment target on or within the semiconductor substrate;
detecting a second reflection pattern of the laser beam off the alignment target at the first focus height; and
comparing data derived from the first and second reflection patterns to determine the slope.

25. A method according to claim 21, wherein the machine is characterized by a thermal state associated with its operation to selectively irradiate structures on or within a planar semiconductor substrate using the laser beam, and the method is performed while the machine is at least approximately in said thermal state.

26. A method according to claim 21, wherein the adjustable optical element comprises a mirror and an actuator, wherein the actuator is configured to adjust an angle at which the mirror is oriented.

27. A method according to claim 21, wherein the adjustable optical element comprises an optical tilt plate and an actuator, wherein the actuator is configured to adjust an angle at which the tilt plate is oriented.

28. A method according to claim 21, wherein the adjustable optical element is selected from the group consisting of an acoustic-optic modulator, acoustic-optic deflector, electro-optic modulator, electro-optic deflector, and deformable mirror.

29. A method according to claim 21, wherein the adjustable optical element comprises an actuator receiving said at least one signal, and an optical element connected to the actuator.

30. A method according to claim 21, further comprising:
continuously and dynamically adjusting the adjustable optical element.

31. A method according to claim 21, wherein the adjustment is an open-loop adjustment.

32. A method according to claim 21, wherein the adjustment is made when the machine is not selectively irradiating conductive links.

33. A method according to claim 21, wherein the conductive links are laser-severable conductive links that are severed and thereby made non-conductive when irradiated with the laser beam.

34. A method according to claim 21, wherein the static alignment of the laser beam path is improved according to a predetermined criteria.

35. A method according to claim 21, wherein the machine comprises an enclosure covering at least a portion of the beam path, and the adjusting step is performed without removing the enclosure.

36. A machine for selectively irradiating conductive links on or within a semiconductor substrate using a laser beam, the machine comprising:
a laser that generates the laser beam;

a beam path along which the laser beam propagates, the beam path having an axis extending from the laser to a laser beam spot at a location on or within the semiconductor substrate, wherein the beam path is subject to one or more uncontrolled variations;

an adjustable optical element effecting the axis of the beam path;

a processor electrically connected to the adjustable optical element and configured to generate, based on at least one measured characteristic of the laser beam, at least one electrical signal to adjust the adjustable optical element so as to compensate for at least one of said one or more uncontrolled variations and thereby to make a discrete improvement to static alignment of the beam path, wherein said at least one measured characteristic comprises a slope at which the laser beam is incident upon the semiconductor substrate; and an enclosure covering at least a portion of the beam path, wherein the adjustable optical element is adjustable without removing the enclosure.

37. A machine according to claim 36, wherein said one or more uncontrolled variations comprise thermal drift affecting the beam path.

38. A machine according to claim 36, wherein the processor is further configured to cause the machine to automatically measure the measured characteristic.

39. A machine according to claim 36, wherein said at least one measured characteristic comprises a position of the laser beam spot on or within the semiconductor substrate.

40. A machine according to claim 36, wherein said at least one measured characteristic of the laser beam is measured by scanning the laser beam spot over an alignment target on or within the semiconductor substrate and detecting a reflection of the laser beam off the alignment target.

41. A machine according to claim 36, wherein the machine is characterized by a thermal state associated with its operation to selectively irradiate structures on or within the semiconductor substrate using the laser beam, and the adjustable optical element is adjustable while the machine is at least approximately in said thermal state.

42. A machine according to claim 36, wherein the adjustable optical element comprises a mirror and an actuator, wherein the actuator is configured to adjust an angle at which the mirror is oriented.

43. A machine according to claim 36, wherein the adjustable optical element comprises an optical tilt plate and an actuator, wherein the actuator is configured to adjust an angle at which the tilt plate is oriented.

44. A machine according to claim 36, wherein the adjustable optical element is selected from the group consisting of an acoustic-optic modulator, acoustic-optic deflector, electro-optic modulator, electro-optic deflector, and deformable mirror.

45. A machine according to claim 36, wherein the adjustable optical element comprises an actuator receiving said at least one signal, and an optical element connected to the actuator.

46. A machine according to claim 36, wherein adjustment of the adjustable optical element is an open-loop adjustment.

* * * * *